United States Patent
Melli et al.

(10) Patent No.: US 12,117,630 B2
(45) Date of Patent: Oct. 15, 2024

(54) METHOD OF FABRICATING DISPLAY DEVICE HAVING PATTERNED LITHIUM-BASED TRANSITION METAL OXIDE

(71) Applicant: Magic Leap, Inc., Plantation, FL (US)

(72) Inventors: Mauro Melli, San Leandro, CA (US); Christophe Peroz, San Francisco, CA (US); Melanie Maputol West, San Francisco, CA (US)

(73) Assignee: MAGIC LEAP, INC., Plantation, FL (US)

( * ) Notice: Subject to any disclaimer, the term of this patent is extended or adjusted under 35 U.S.C. 154(b) by 478 days.

(21) Appl. No.: 17/437,729

(22) PCT Filed: Mar. 11, 2020

(86) PCT No.: PCT/US2020/021987
§ 371 (c)(1),
(2) Date: Sep. 9, 2021

(87) PCT Pub. No.: WO2020/185832
PCT Pub. Date: Sep. 17, 2020

(65) Prior Publication Data
US 2022/0155502 A1    May 19, 2022

Related U.S. Application Data

(60) Provisional application No. 62/817,393, filed on Mar. 12, 2019.

(51) Int. Cl.
*G02B 5/18* (2006.01)
*F21V 8/00* (2006.01)
*G02B 27/01* (2006.01)

(52) U.S. Cl.
CPC ......... *G02B 5/1857* (2013.01); *G02B 6/0016* (2013.01); *G02B 27/0172* (2013.01); *B81C 2201/0132* (2013.01)

(58) Field of Classification Search
None
See application file for complete search history.

(56) References Cited

U.S. PATENT DOCUMENTS 5,567,333 A * 10/1996 Hira ................... G11B 5/3106
6,850,221 B1    2/2005 Tickle
(Continued)

FOREIGN PATENT DOCUMENTS

| CN | 1985195 A | 6/2007 |
| JP | 2003521684 A | 7/2003 |

(Continued)

OTHER PUBLICATIONS

International Search Report and Written Opinion for PCT Application No. PCT/US2020/021967, mailed May 14, 2020.
(Continued)

*Primary Examiner* — Allan W. Olsen
(74) *Attorney, Agent, or Firm* — Seed IP Law Group LLP

(57) ABSTRACT

The present disclosure generally relates to display systems, and more particularly to augmented reality display systems and methods of fabricating the same. A method of fabricating a display device includes providing a substrate comprising a lithium (Li)-based oxide and forming an etch mask pattern exposing regions of the substrate. The method additionally includes plasma etching the exposed regions of the substrate using a gas mixture comprising CHF3 to form a diffractive optical element, wherein the diffractive optical element comprises Li-based oxide features configured to diffract visible light incident thereon.

28 Claims, 25 Drawing Sheets

(56) References Cited

U.S. PATENT DOCUMENTS

| | | |
|---|---|---|
| 6,873,764 B2 | 3/2005 | Maisenholder et al. |
| 7,332,417 B2 | 2/2008 | Westhoff et al. |
| 9,739,918 B2 | 8/2017 | Arbabi et al. |
| 2003/0091284 A1 | 5/2003 | Maisenholder et al. |
| 2003/0099897 A1 | 5/2003 | Fedynshyn |
| 2006/0028436 A1 | 2/2006 | Armstrong |
| 2007/0081123 A1 | 4/2007 | Lewis |
| 2008/0038660 A1 | 2/2008 | Doneda et al. |
| 2012/0127062 A1 | 5/2012 | Bar-Zeev et al. |
| 2012/0162549 A1 | 6/2012 | Gao et al. |
| 2013/0082922 A1 | 4/2013 | Miller |
| 2013/0117377 A1 | 5/2013 | Miller |
| 2013/0125027 A1 | 5/2013 | Abovitz |
| 2013/0208234 A1 | 8/2013 | Lewis |
| 2013/0242262 A1 | 9/2013 | Lewis |
| 2014/0071539 A1 | 3/2014 | Gao |
| 2014/0177023 A1 | 6/2014 | Gao et al. |
| 2014/0218468 A1 | 8/2014 | Gao et al. |
| 2014/0267420 A1 | 9/2014 | Schowengerdt |
| 2015/0016777 A1 | 1/2015 | Abovitz et al. |
| 2015/0103306 A1 | 4/2015 | Kaji et al. |
| 2015/0178939 A1 | 6/2015 | Bradski et al. |
| 2015/0205126 A1 | 7/2015 | Schowengerdt |
| 2015/0309263 A2 | 10/2015 | Abovitz et al. |
| 2015/0326570 A1 | 11/2015 | Publicover et al. |
| 2015/0346495 A1 | 12/2015 | Welch et al. |
| 2016/0011419 A1 | 1/2016 | Gao |
| 2016/0026253 A1 | 1/2016 | Bradski et al. |
| 2017/0178894 A1 | 6/2017 | Stone et al. |
| 2018/0052501 A1 | 2/2018 | Jones, Jr. et al. |
| 2018/0186689 A1 | 7/2018 | Melli et al. |
| 2018/0275350 A1 | 9/2018 | Oh et al. |

FOREIGN PATENT DOCUMENTS

| | | |
|---|---|---|
| JP | 2003521728 A | 7/2003 |
| JP | 2004296774 A | 10/2004 |
| JP | 2006520096 A | 8/2006 |
| JP | 2017527857 A | 9/2017 |
| WO | WO 0155691 A2 | 8/2001 |
| WO | WO 2004068556 A2 | 8/2004 |
| WO | WO 2016044104 A1 | 3/2016 |
| WO | WO 2020/185832 | 9/2020 |

OTHER PUBLICATIONS

International Preliminary Report on Patentability for PCT Application No. PCT/US2020/021967, issued Aug. 25, 2021.

ARToolKit: https://web.archive.org/web/20051013062315/http://www.hitl.washington.edu:80/artoolkit/documentation/hardware.htm, archived Oct. 13, 2005.

Azuma, "A Survey of Augmented Reality," Teleoperators and Virtual Environments 6, 4 (Aug. 1997), pp. 355-385. https://web.archive.org/web/20010604100006/http://www.cs.unc.edu/~azuma/ARpresence.pdf.

Azuma, "Predictive Tracking for Augmented Realty," TR95-007, Department of Computer Science, UNC—Chapel Hill, NC, Feb. 1995.

Bimber, et al., "Spatial Augmented Reality—Merging Real and Virtual Worlds," 2005 https://web.media.mit.edu/~raskar/book/BimberRaskarAugmentedRealityBook.pdf.

Jacob, "Eye Tracking in Advanced Interface Design," Human-Computer Interaction Lab Naval Research Laboratory, Washington, D.C. / paper/ in Virtual Environments and Advanced Interface Design, ed. by W. Barfield and T.A. Furness, pp. 258-288, Oxford University Press, New York (1995).

Tanriverdi and Jacob, "Interacting With Eye Movements in Virtual Environments," Department of Electrical Engineering and Computer Science, Tufts University, Medford, MA—paper/Proc. ACM CHI 2000 Human Factors in Computing Systems Conference, pp. 265-272, Addison-Wesley/ACM Press (2000).

* cited by examiner

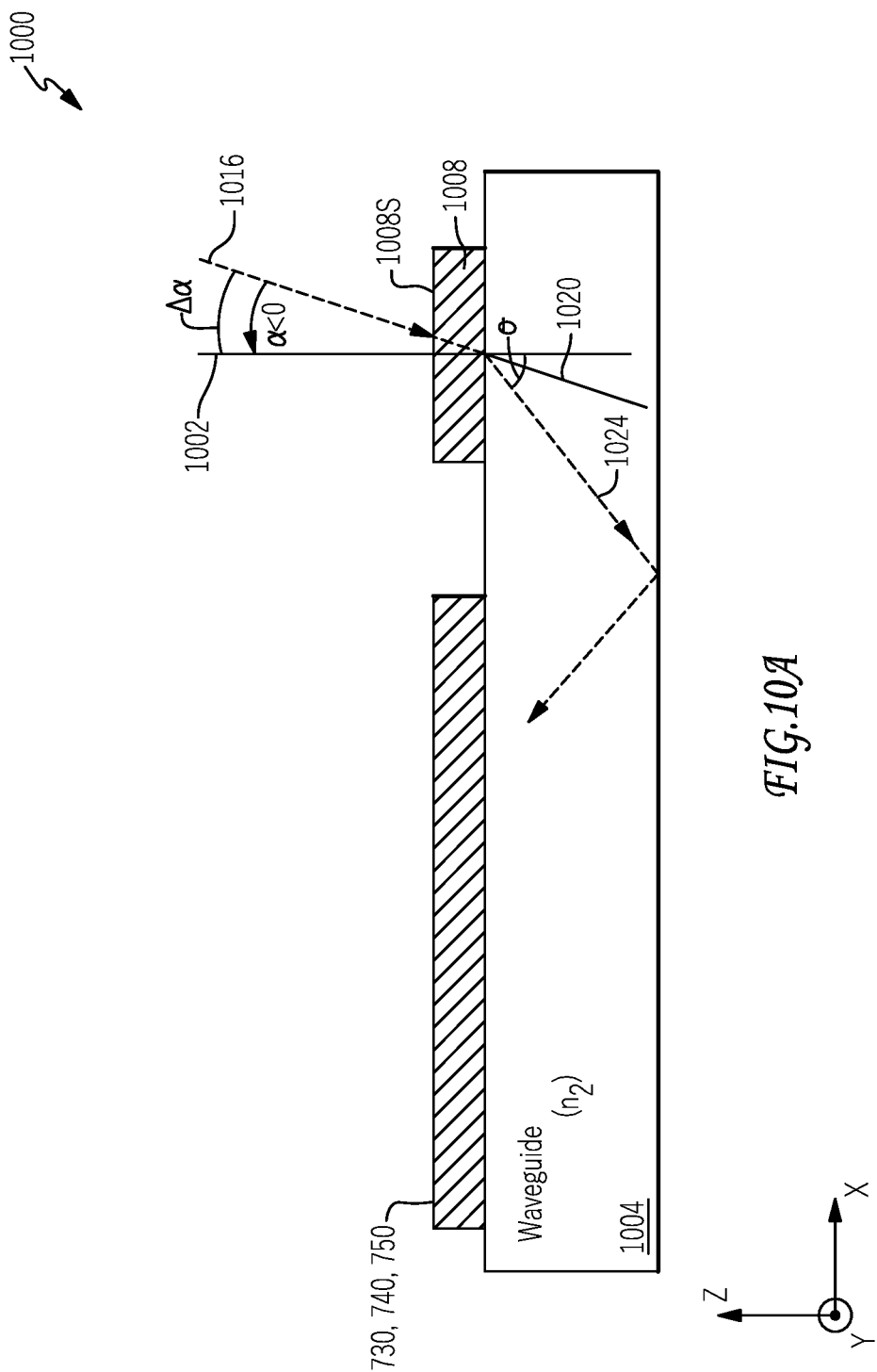

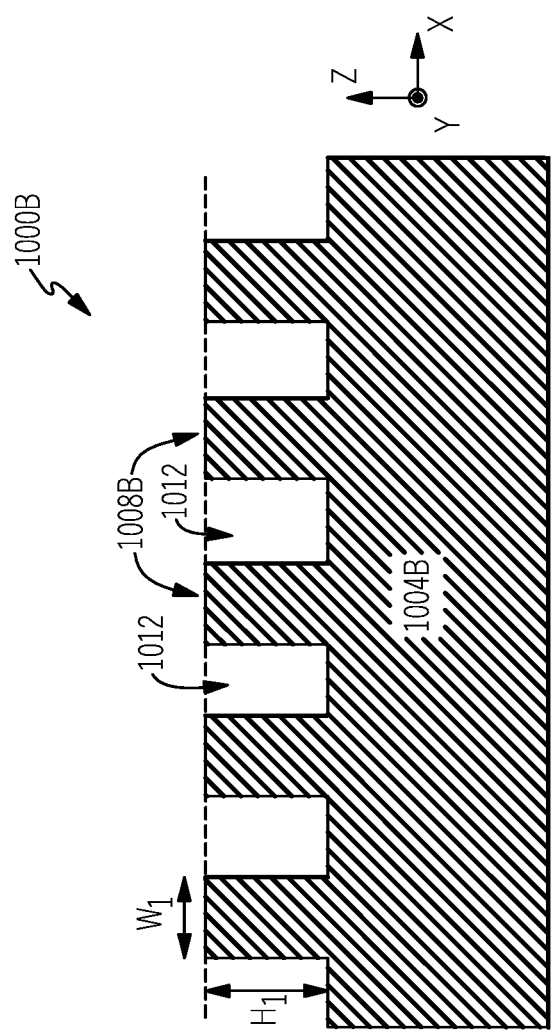

METHOD OF FABRICATING DISPLAY DEVICE HAVING PATTERNED LITHIUM-BASED TRANSITION METAL OXIDE

CROSS-REFERENCE TO RELATED APPLICATIONS

This application claims the benefit of priority to U.S. Provisional Patent Application No. 62/817,393, filed Mar. 12, 2019, entitled "METHOD OF FABRICATING DISPLAY DEVICE HAVING PATTERNED LITHIUM-BASED TRANSITION METAL OXIDE," the content of which is hereby incorporated by reference herein in its entirety.

INCORPORATION BY REFERENCE

This application incorporates by reference the entirety of each of the following patent applications: U.S. application Ser. No. 14/555,585 filed on Nov. 27, 2014, published on Jul. 23, 2015 as U.S. Publication No. 2015/0205126; U.S. application Ser. No. 14/690,401 filed on Apr. 18, 2015, published on Oct. 22, 2015 as U.S. Publication No. 2015/0302652; U.S. application Ser. No. 14/212,961 filed on Mar. 14, 2014, now U.S. Pat. No. 9,417,452 issued on Aug. 16, 2016; and U.S. application Ser. No. 14/331,218 filed on Jul. 14, 2014, published on Oct. 29, 2015 as U.S. Publication No. 2015/0309263.

BACKGROUND

Field

The present disclosure relates to display systems and, more particularly, to augmented and virtual reality display systems.

Description of the Related Art

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user. A mixed reality, or "MR", scenario is a type of AR scenario and typically involves virtual objects that are integrated into, and responsive to, the natural world. For example, in an MR scenario, AR image content may be blocked by or otherwise be perceived as interacting with objects in the real world.

Referring to FIG. 1, an augmented reality scene 10 is depicted wherein a user of an AR technology sees a real-world park-like setting 20 featuring people, trees, buildings in the background, and a concrete platform 30. In addition to these items, the user of the AR technology also perceives that he "sees" "virtual content" such as a robot statue 40 standing upon the real-world platform 30, and a cartoon-like avatar character 50 flying by which seems to be a personification of a bumble bee, even though these elements 40, 50 do not exist in the real world. Because the human visual perception system is complex, it is challenging to produce an AR technology that facilitates a comfortable, natural-feeling, rich presentation of virtual image elements amongst other virtual or real-world imagery elements.

Systems and methods disclosed herein address various challenges related to AR and VR technology.

SUMMARY

Accordingly, numerous devices, systems, structures and methods disclosed herein are directed generally to display systems, and more particularly to augmented reality display systems, and methods of fabricating the same.

For instance, an example method of fabricating a display device includes providing a substrate comprising a lithium (Li)-based oxide and forming an etch mask pattern exposing regions of the substrate. The method additionally includes plasma etching the exposed regions of the substrate using a gas mixture comprising $CHF_3$ to form a diffractive optical element, wherein the diffractive optical element comprises Li-based oxide features configured to diffract visible light incident thereon.

Another example method of fabricating a display device includes providing a substrate comprising a lithium (Li)-based oxide and forming an etch mask pattern comprising exposed regions of the substrate. The method additionally includes plasma etching the exposed regions of the substrate using a gas mixture comprising $CHF_3$ and $H_2$ to form a patterned Li-based oxide structure.

BRIEF DESCRIPTION OF THE DRAWINGS

FIG. 10A illustrates a cross-sectional view of a waveguide having disposed thereon a diffraction grating showing a field of view (FOV) of the waveguide, $\Delta\alpha$.

FIG. 10C schematically illustrates a cross-sectional view of a portion of a waveguide having disposed thereon a diffraction grating comprising a Li-based oxide.

Figure 1:
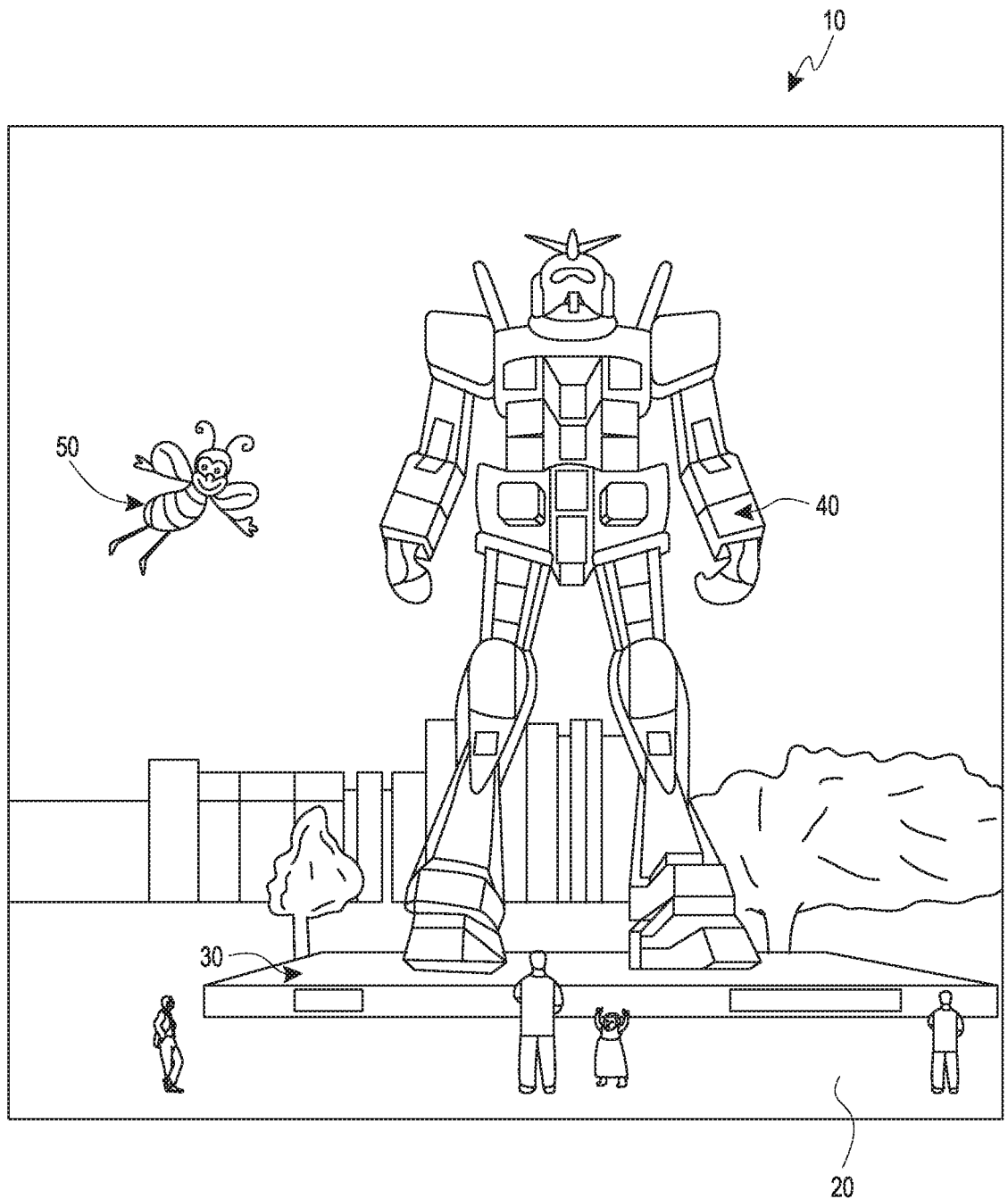
FIG. 1 illustrates a user's view of augmented reality (AR) through an AR device.

Throughout the drawings, reference numbers may be re-used to indicate correspondence between referenced elements. The drawings are provided to illustrate example embodiments described herein and are not intended to limit the scope of the disclosure.

DETAILED DESCRIPTION

AR systems may display virtual content to a user, or viewer, while still allowing the user to see the world around them. Preferably, this content is displayed on a head-mounted display, e.g., as part of eyewear, that projects image information to the user's eyes. In addition, the display may also transmit light from the surrounding environment to the user's eyes, to allow a view of that surrounding environment. As used herein, it will be appreciated that a "head-mounted" or "head mountable" display is a display that may be mounted on the head of a viewer or user.

In some AR systems, virtual/augmented/mixed display having a relatively high field of view (FOV) can enhance the viewing experience. The FOV of the display depends on the angle of light output by waveguides of the eyepiece, through which the viewer sees images projected into his or her eye. A waveguide having a relatively high refractive index, e.g., 2.0 or greater, can provide a relatively high FOV. However, to efficiently couple light into the high refractive index waveguide, the diffractive optical coupling elements should also have a correspondingly high refractive index. To achieve this goal, among other advantages, some displays for AR systems according to embodiments described herein include a waveguide comprising a relatively high index (e.g., greater than or equal to 2.0) material, wherein the waveguide has formed thereon diffraction gratings with correspondingly high refractive index, e.g., diffraction gratings formed of a Li-based oxide. For example, a diffraction grating may be formed directly on a Li-based oxide waveguide by patterning a surface portion of the waveguide formed of a Li-based oxide.

Advantageously, to fabricate such diffraction gratings, a method of fabricating a diffraction grating comprising a Li-based oxide includes using an etch mask pattern to periodically expose an underlying substrate comprising the Li-based oxide and plasma etching in a gas mixture comprising $CHF_3$ under plasma etch conditions such that the exposed regions of the substrate are etched to form a patterned Li-based oxide structure having Li-based oxide features formed at a surface. According to various embodiments, the patterned Li-based oxide features can include lines that are separated by spaces and periodically repeat in a lateral direction, such that the resulting structure can be configured as a diffraction grating that can in-couple or out-couple light by diffracting light incident thereon at relatively wide FOV.

Reference will now be made to the drawings, in which like reference numerals refer to like parts throughout. Unless indicated otherwise, the drawings are schematic not necessarily drawn to scale.

Figure 2:
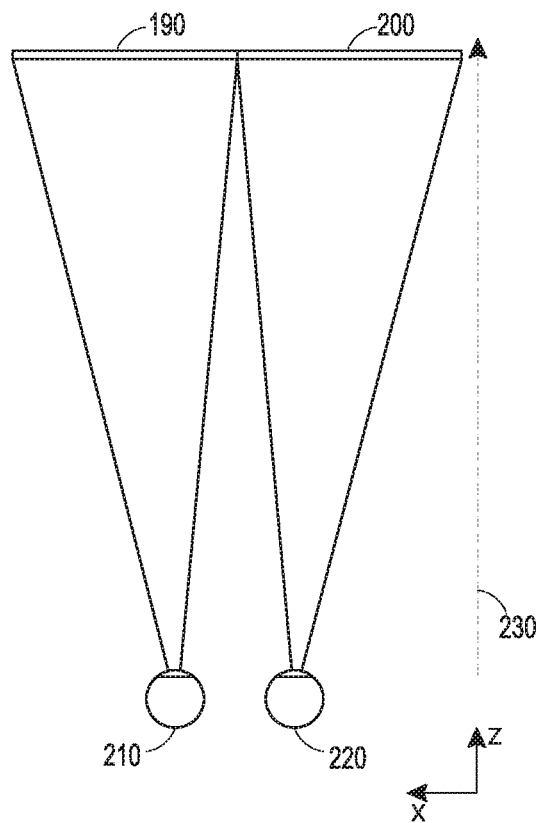
FIG. 2 illustrates a conventional display system for simulating three-dimensional imagery for a user.

FIG. 2 illustrates a conventional display system for simulating three-dimensional imagery for a user. It will be appreciated that a user's eyes are spaced apart and that, when looking at a real object in space, each eye will have a slightly different view of the object and may form an image of the object at different locations on the retina of each eye. This may be referred to as binocular disparity and may be utilized by the human visual system to provide a perception of depth. Conventional display systems simulate binocular disparity by presenting two distinct images 190, 200 with slightly different views of the same virtual object—one for each eye 210, 220—corresponding to the views of the virtual object that would be seen by each eye were the virtual object a real object at a desired depth. These images provide binocular cues that the user's visual system may interpret to derive a perception of depth.

With continued reference to FIG. 2, the images 190, 200 are spaced from the eyes 210, 220 by a distance 230 on a z-axis. The z-axis is parallel to the optical axis of the viewer with their eyes fixated on an object at optical infinity directly ahead of the viewer. The images 190, 200 are flat and at a fixed distance from the eyes 210, 220. Based on the slightly different views of a virtual object in the images presented to the eyes 210, 220, respectively, the eyes may naturally rotate such that an image of the object falls on corresponding points on the retinas of each of the eyes, to maintain single binocular vision. This rotation may cause the lines of sight of each of the eyes 210, 220 to converge onto a point in space at which the virtual object is perceived to be present. As a result, providing three-dimensional imagery conventionally involves providing binocular cues that may manipulate the vergence of the user's eyes 210, 220, and that the human visual system interprets to provide a perception of depth.

Figure 3A:
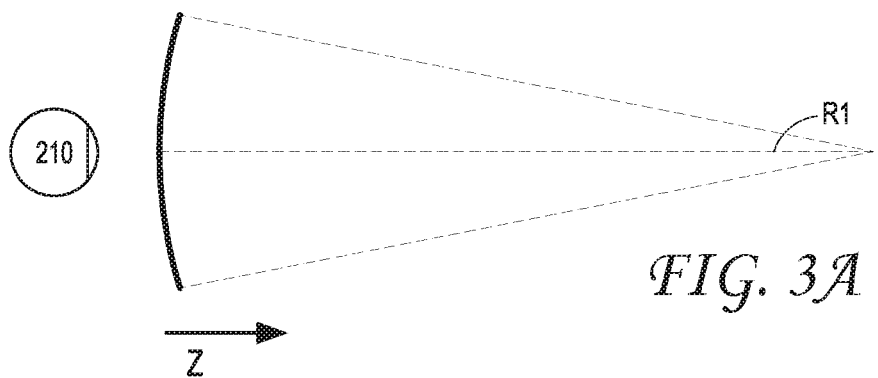
FIGS. 3A-3C illustrate relationships between radius of curvature and focal radius.
Figure 3B:
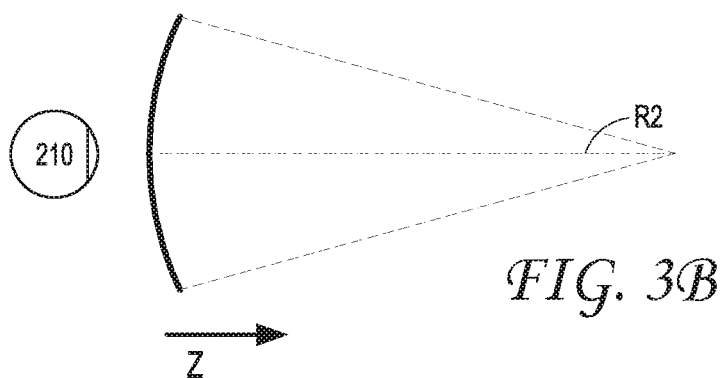
Figure 3C:
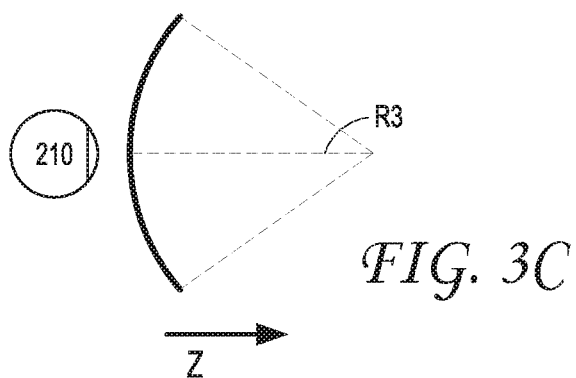

Generating a realistic and comfortable perception of depth is challenging, however. It will be appreciated that light from objects at different distances from the eyes have wavefronts with different amounts of divergence. FIGS. 3A-3C illustrate relationships between distance and the divergence of light rays. The distance between the object and the eye 210 is represented by, in order of decreasing distance, R1, R2, and R3. As shown in FIGS. 3A-3C, the light rays become more divergent as distance to the object decreases. Conversely, as distance increases, the light rays become more collimated. Stated another way, it may be said that the light field produced by a point (the object or a part of the object) has a spherical wavefront curvature, which is a function of how far away the point is from the eye of the user. The curvature increases with decreasing distance between the object and the eye 210. While only a single eye 210 is illustrated for clarity of illustration in FIGS. 3A-3C and other figures herein, the discussions regarding eye 210 may be applied to both eyes 210 and 220 of a viewer.

With continued reference to FIGS. 3A-3C, light from an object that the viewer's eyes are fixated on may have different degrees of wavefront divergence. Due to the different amounts of wavefront divergence, the light may be focused differently by the lens of the eye, which in turn may require the lens to assume different shapes to form a focused image on the retina of the eye. Where a focused image is not formed on the retina, the resulting retinal blur acts as a cue to accommodation that causes a change in the shape of the lens of the eye until a focused image is formed on the retina. For example, the cue to accommodation may trigger the ciliary muscles surrounding the lens of the eye to relax or contract, thereby modulating the force applied to the suspensory ligaments holding the lens, thus causing the shape of the lens of the eye to change until retinal blur of an object of fixation is eliminated or minimized, thereby forming a focused image of the object of fixation on the retina (e.g., fovea) of the eye. The process by which the lens of the eye changes shape may be referred to as accommodation, and the shape of the lens of the eye required to form a focused image of the object of fixation on the retina (e.g., fovea) of the eye may be referred to as an accommodative state.

Figure 4A:
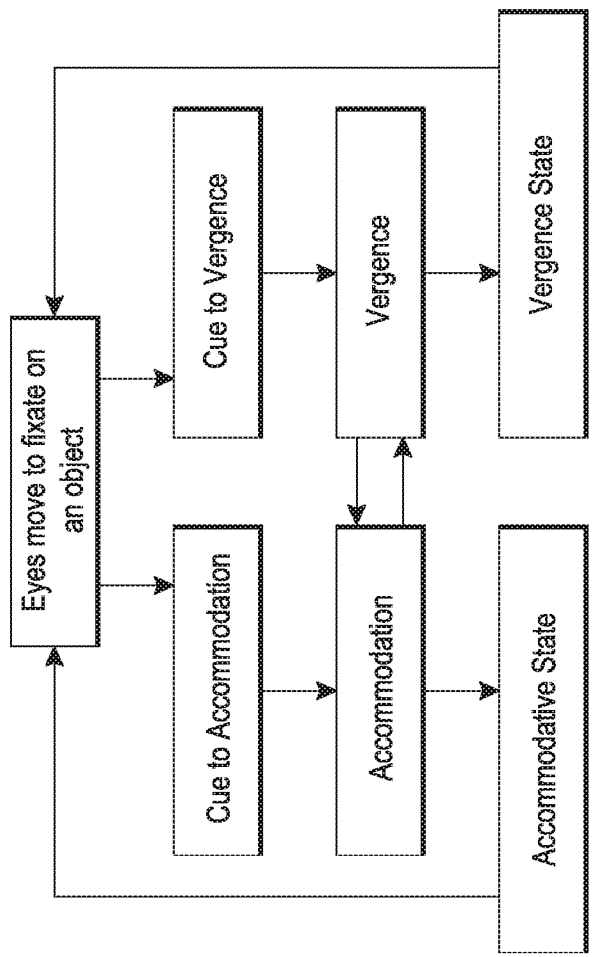
FIG. 4A illustrates a representation of the accommodation-vergence response of the human visual system.

With reference now to FIG. 4A, a representation of the accommodation-vergence response of the human visual system is illustrated. The movement of the eyes to fixate on an object causes the eyes to receive light from the object, with the light forming an image on each of the retinas of the eyes. The presence of retinal blur in the image formed on the retina may provide a cue to accommodation, and the relative locations of the image on the retinas may provide a cue to vergence. The cue to accommodation causes accommodation to occur, resulting in the lenses of the eyes each assuming a particular accommodative state that forms a focused image of the object on the retina (e.g., fovea) of the eye. On the other hand, the cue to vergence causes vergence movements (rotation of the eyes) to occur such that the images formed on each retina of each eye are at corresponding retinal points that maintain single binocular vision. In these positions, the eyes may be said to have assumed a particular vergence state. With continued reference to FIG. 4A, accommodation may be understood to be the process by which the eye achieves a particular accommodative state, and vergence may be understood to be the process by which the eye achieves a particular vergence state. As indicated in FIG. 4A, the accommodative and vergence states of the eyes may change if the user fixates on another object. For example, the accommodated state may change if the user fixates on a new object at a different depth on the z-axis.

Without being limited by theory, it is believed that viewers of an object may perceive the object as being "three-dimensional" due to a combination of vergence and accommodation. As noted above, vergence movements (e.g., rotation of the eyes so that the pupils move toward or away from each other to converge the lines of sight of the eyes to fixate upon an object) of the two eyes relative to each other are closely associated with accommodation of the lenses of the eyes. Under normal conditions, changing the shapes of the lenses of the eyes to change focus from one object to another object at a different distance will automatically cause a matching change in vergence to the same distance, under a relationship known as the "accommodation-vergence reflex." Likewise, a change in vergence will trigger a matching change in lens shape under normal conditions.

Figure 4B:
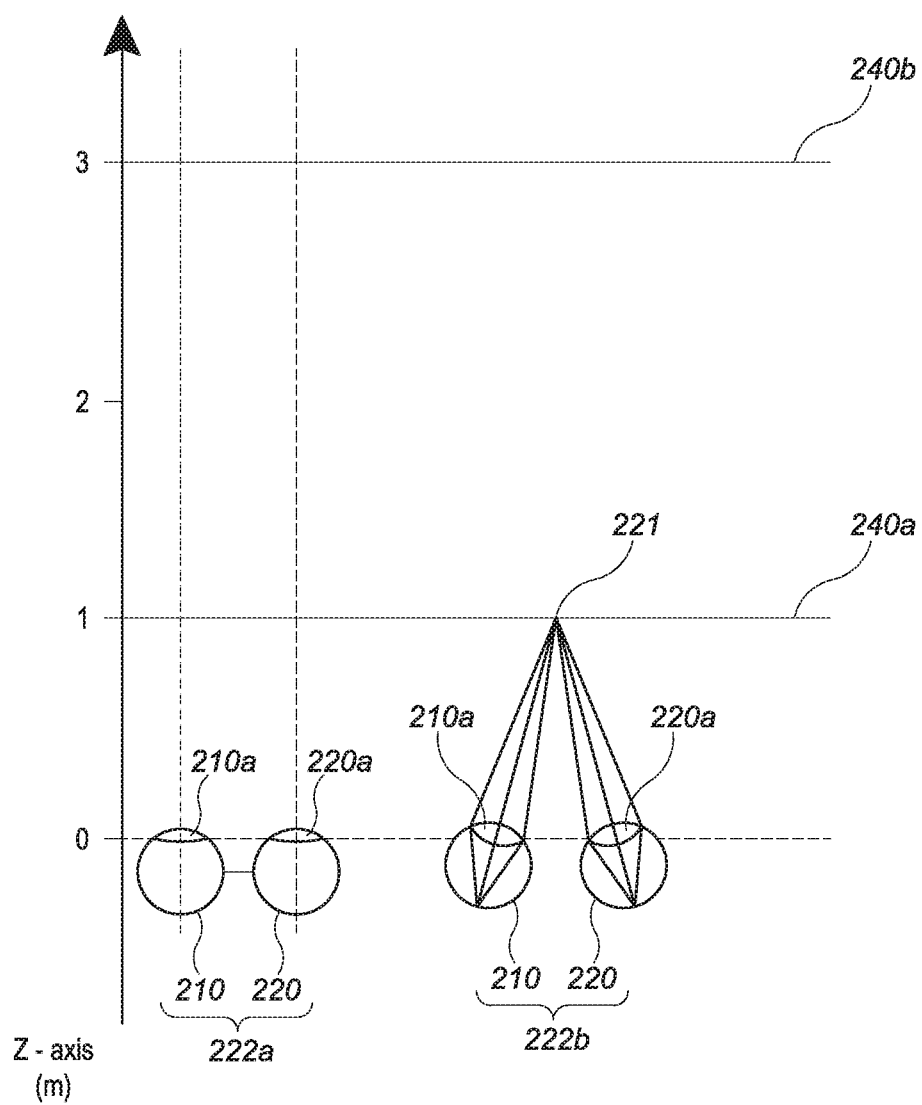
FIG. 4B illustrates examples of different accommodative states and vergence states of a pair of eyes of the user.

With reference now to FIG. 4B, examples of different accommodative and vergence states of the eyes are illustrated. The pair of eyes 222a is fixated on an object at optical infinity, while the pair eyes 222b are fixated on an object 221 at less than optical infinity. Notably, the vergence states of each pair of eyes is different, with the pair of eyes 222a directed straight ahead, while the pair of eyes 222 converge on the object 221. The accommodative states of the eyes forming each pair of eyes 222a and 222b are also different, as represented by the different shapes of the lenses 210a, 220a.

Undesirably, many users of conventional "3-D" display systems find such conventional systems to be uncomfortable or may not perceive a sense of depth at all due to a mismatch between accommodative and vergence states in these displays. As noted above, many stereoscopic or "3-D" display systems display a scene by providing slightly different images to each eye. Such systems are uncomfortable for many viewers, since they, among other things, simply provide different presentations of a scene and cause changes in the vergence states of the eyes, but without a corresponding change in the accommodative states of those eyes. Rather, the images are shown by a display at a fixed distance from the eyes, such that the eyes view all the image information at a single accommodative state. Such an arrangement works against the "accommodation-vergence reflex" by causing changes in the vergence state without a matching change in the accommodative state. This mismatch is believed to cause viewer discomfort. Display systems that provide a better match between accommodation and vergence may form more realistic and comfortable simulations of three-dimensional imagery.

Without being limited by theory, it is believed that the human eye typically may interpret a finite number of depth planes to provide depth perception. Consequently, a highly believable simulation of perceived depth may be achieved by providing, to the eye, different presentations of an image corresponding to each of these limited numbers of depth planes. In some embodiments, the different presentations may provide both cues to vergence and matching cues to accommodation, thereby providing physiologically correct accommodation-vergence matching.

With continued reference to FIG. 4B, two depth planes 240, corresponding to different distances in space from the eyes 210, 220, are illustrated. For a given depth plane 240, vergence cues may be provided by the displaying of images of appropriately different perspectives for each eye 210, 220. In addition, for a given depth plane 240, light forming the images provided to each eye 210, 220 may have a wavefront divergence corresponding to a light field produced by a point at the distance of that depth plane 240.

In the illustrated embodiment, the distance, along the z-axis, of the depth plane 240 containing the point 221 is 1 m. As used herein, distances or depths along the z-axis may be measured with a zero-point located at the exit pupils of the user's eyes. Thus, a depth plane 240 located at a depth of 1 m corresponds to a distance of 1 m away from the exit pupils of the user's eyes, on the optical axis of those eyes with the eyes directed towards optical infinity. As an approximation, the depth or distance along the z-axis may be measured from the display in front of the user's eyes (e.g., from the surface of a waveguide), plus a value for the distance between the device and the exit pupils of the user's eyes. That value may be called the eye relief and corresponds to the distance between the exit pupil of the user's eye and the display worn by the user in front of the eye. In practice, the value for the eye relief may be a normalized value used generally for all viewers. For example, the eye relief may be assumed to be 20 mm and a depth plane that is at a depth of 1 m may be at a distance of 980 mm in front of the display.

Figure 4C:
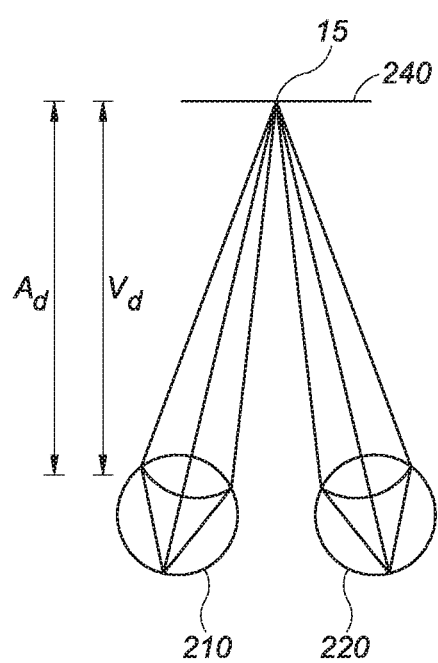
FIG. 4C illustrates an example of a representation of a top-down view of a user viewing content via a display system.
Figure 4D:
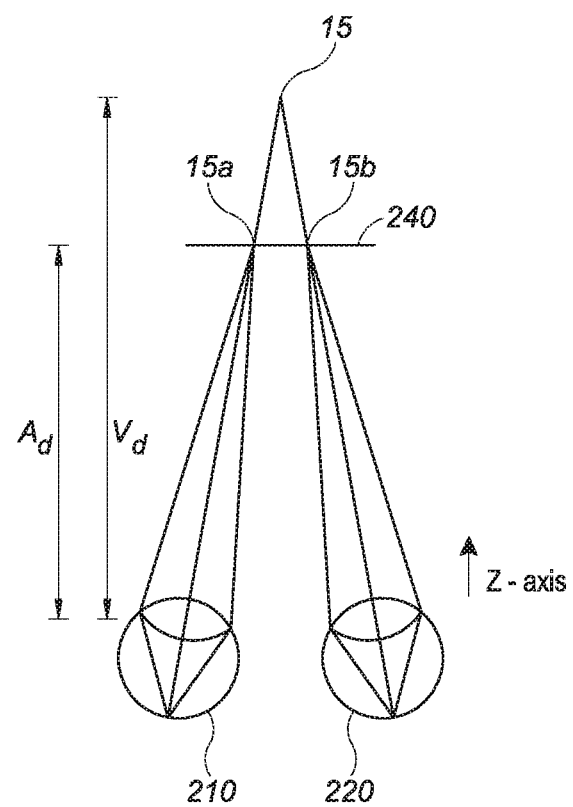
FIG. 4D illustrates another example of a representation of a top-down view of a user viewing content via a display system.

With reference now to FIGS. 4C and 4D, examples of matched accommodation-vergence distances and mismatched accommodation-vergence distances are illustrated, respectively. As illustrated in FIG. 4C, the display system may provide images of a virtual object to each eye 210, 220. The images may cause the eyes 210, 220 to assume a vergence state in which the eyes converge on a point 15 on a depth plane 240. In addition, the images may be formed by a light having a wavefront curvature corresponding to real objects at that depth plane 240. As a result, the eyes 210, 220 assume an accommodative state in which the images are in focus on the retinas of those eyes. Thus, the user may perceive the virtual object as being at the point 15 on the depth plane 240.

It will be appreciated that each of the accommodative and vergence states of the eyes 210, 220 are associated with a particular distance on the z-axis. For example, an object at a particular distance from the eyes 210, 220 causes those eyes to assume particular accommodative states based upon the distances of the object. The distance associated with a particular accommodative state may be referred to as the accommodation distance, $A_d$. Similarly, there are particular vergence distances, $V_d$, associated with the eyes in particular vergence states, or positions relative to one another. Where the accommodation distance and the vergence distance match, the relationship between accommodation and vergence may be said to be physiologically correct. This is considered to be the most comfortable scenario for a viewer.

In stereoscopic displays, however, the accommodation distance and the vergence distance may not always match. For example, as illustrated in FIG. 4D, images displayed to the eyes 210, 220 may be displayed with wavefront divergence corresponding to depth plane 240, and the eyes 210, 220 may assume a particular accommodative state in which the points 15a, 15b on that depth plane are in focus. However, the images displayed to the eyes 210, 220 may provide cues for vergence that cause the eyes 210, 220 to converge on a point 15 that is not located on the depth plane 240. As a result, the accommodation distance corresponds to the distance from the exit pupils of the eyes 210, 220 to the depth plane 240, while the vergence distance corresponds to the larger distance from the exit pupils of the eyes 210, 220 to the point 15, in some embodiments. The accommodation distance is different from the vergence distance. Consequently, there is an accommodation-vergence mismatch. Such a mismatch is considered undesirable and may cause discomfort in the user. It will be appreciated that the mismatch corresponds to distance (e.g., $V_d$–$A_d$) and may be characterized using diopters.

In some embodiments, it will be appreciated that a reference point other than exit pupils of the eyes 210, 220 may be utilized for determining distance for determining accommodation-vergence mismatch, so long as the same reference point is utilized for the accommodation distance and the vergence distance. For example, the distances could be measured from the cornea to the depth plane, from the retina to the depth plane, from the eyepiece (e.g., a waveguide of the display device) to the depth plane, and so on.

Without being limited by theory, it is believed that users may still perceive accommodation-vergence mismatches of up to about 0.25 diopter, up to about 0.33 diopter, and up to about 0.5 diopter as being physiologically correct, without the mismatch itself causing significant discomfort. In some embodiments, display systems disclosed herein (e.g., the display system 250, FIG. 6) present images to the viewer having accommodation-vergence mismatch of about 0.5 diopter or less. In some other embodiments, the accommodation-vergence mismatch of the images provided by the display system is about 0.33 diopter or less. In yet other embodiments, the accommodation-vergence mismatch of the images provided by the display system is about 0.25 diopter or less, including about 0.1 diopter or less.

Figure 5:
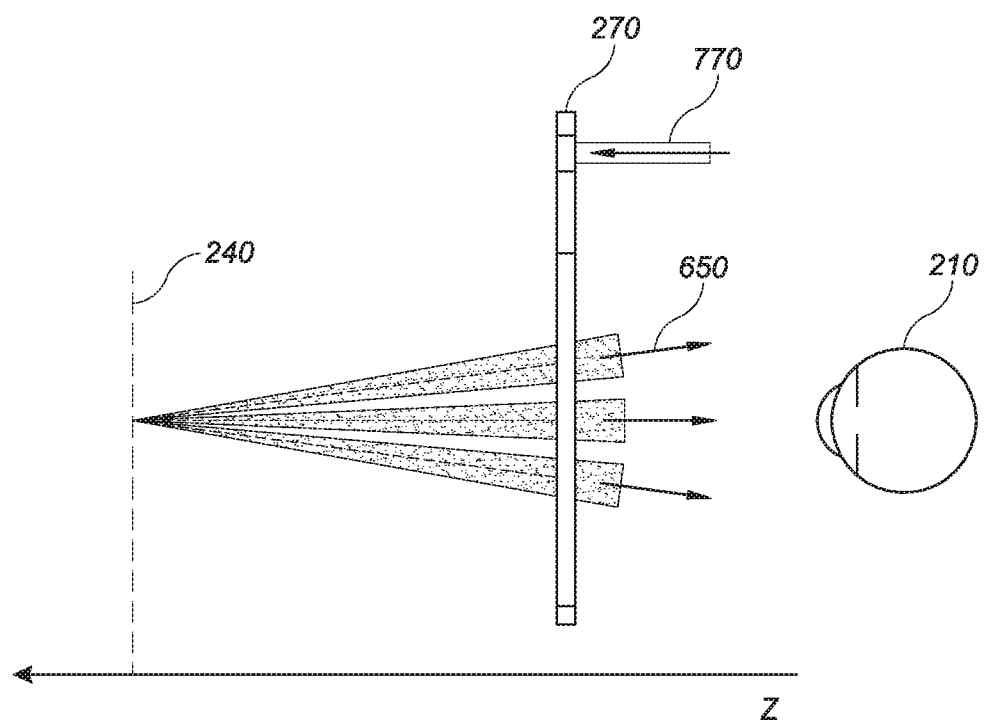
FIG. 5 illustrates aspects of an approach for simulating three-dimensional imagery by modifying wavefront divergence.

FIG. 5 illustrates aspects of an approach for simulating three-dimensional imagery by modifying wavefront divergence. The display system includes a waveguide 270 that is configured to receive light 770 that is encoded with image information, and to output that light to the user's eye 210. The waveguide 270 may output the light 650 with a defined amount of wavefront divergence corresponding to the wavefront divergence of a light field produced by a point on a desired depth plane 240. In some embodiments, the same amount of wavefront divergence is provided for all objects presented on that depth plane. In addition, it will be illustrated that the other eye of the user may be provided with image information from a similar waveguide.

In some embodiments, a single waveguide may be configured to output light with a set amount of wavefront divergence corresponding to a single or limited number of depth planes and/or the waveguide may be configured to output light of a limited range of wavelengths. Consequently, in some embodiments, a plurality or stack of waveguides may be utilized to provide different amounts of wavefront divergence for different depth planes and/or to output light of different ranges of wavelengths. As used herein, it will be appreciated at a depth plane may be planar or may follow the contours of a curved surface.

Figure 6:
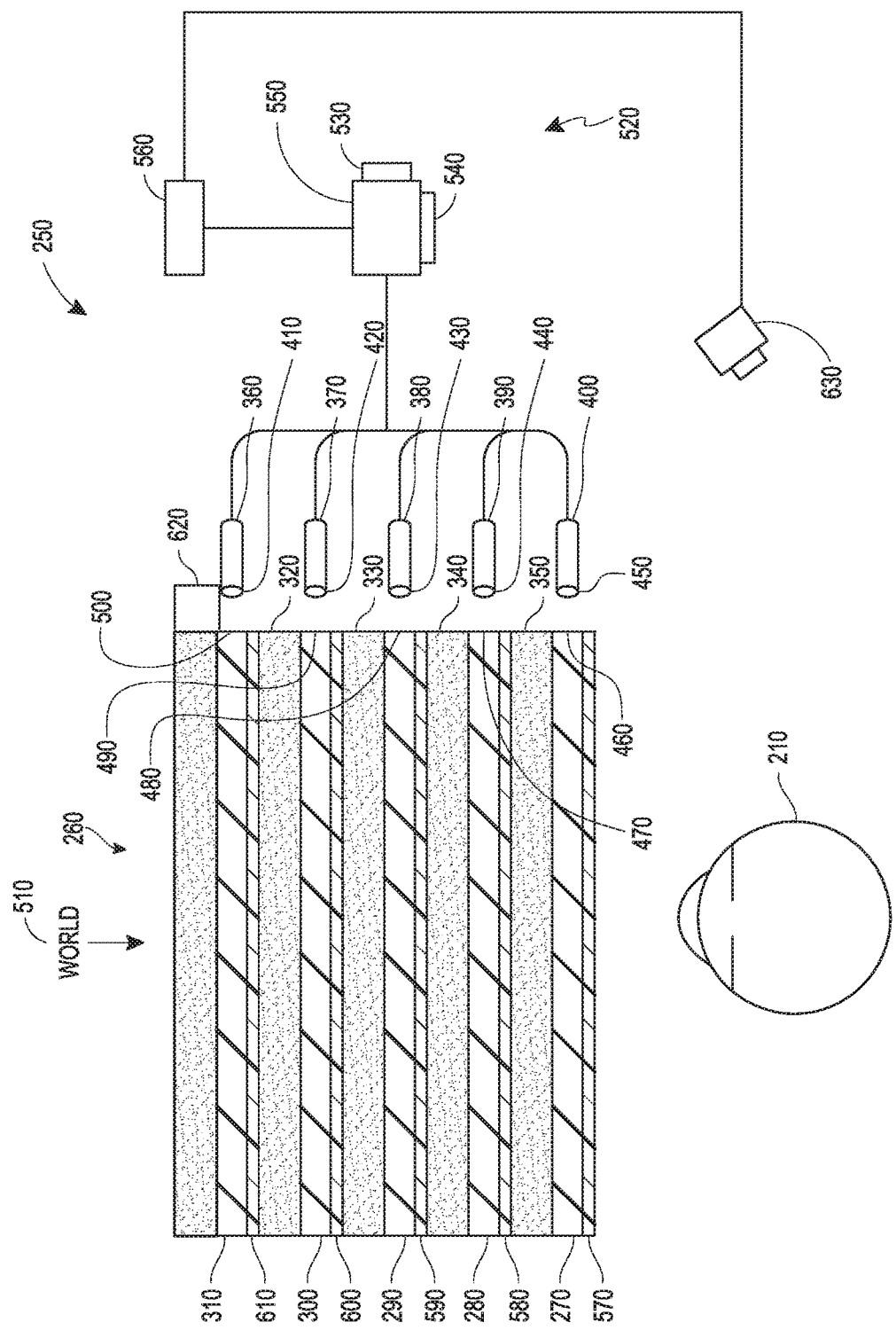
FIG. 6 illustrates an example of a waveguide stack for outputting image information to a user.

FIG. 6 illustrates an example of a waveguide stack for outputting image information to a user. A display system 250 includes a stack of waveguides, or stacked waveguide assembly, 260 that may be utilized to provide three-dimensional perception to the eye/brain using a plurality of waveguides 270, 280, 290, 300, 310. It will be appreciated that the display system 250 may be considered a light field display in some embodiments. In addition, the waveguide assembly 260 may also be referred to as an eyepiece.

In some embodiments, the display system 250 may be configured to provide substantially continuous cues to vergence and multiple discrete cues to accommodation. The cues to vergence may be provided by displaying different images to each of the eyes of the user, and the cues to accommodation may be provided by outputting the light that forms the images with selectable discrete amounts of wavefront divergence. Stated another way, the display system 250 may be configured to output light with variable levels of wavefront divergence. In some embodiments, each discrete level of wavefront divergence corresponds to a particular depth plane and may be provided by a particular one of the waveguides 270, 280, 290, 300, 310.

With continued reference to FIG. 6, the waveguide assembly 260 may also include a plurality of features 320, 330, 340, 350 between the waveguides. In some embodiments, the features 320, 330, 340, 350 may be one or more lenses. The waveguides 270, 280, 290, 300, 310 and/or the plurality of lenses 320, 330, 340, 350 may be configured to send image information to the eye with various levels of wavefront curvature or light ray divergence. Each waveguide level may be associated with a particular depth plane and may be configured to output image information corresponding to that depth plane. Image injection devices 360, 370, 380, 390, 400 may function as a source of light for the waveguides and may be utilized to inject image information into the waveguides 270, 280, 290, 300, 310, each of which may be configured, as described herein, to distribute incoming light across each respective waveguide, for output toward the eye 210. Light exits an output surface 410, 420, 430, 440, 450 of the image injection devices 360, 370, 380, 390, 400 and is injected into a corresponding input surface 460, 470, 480, 490, 500 of the waveguides 270, 280, 290, 300, 310. In some embodiments, each of the input surfaces 460, 470, 480, 490, 500 may be an edge of a corresponding waveguide, or may be part of a major surface of the corresponding waveguide (that is, one of the waveguide surfaces directly facing the world 510 or the viewer's eye 210). In some embodiments, a single beam of light (e.g. a collimated beam) may be injected into each waveguide to output an entire field of cloned collimated beams that are directed toward the eye 210 at particular angles (and amounts of divergence) corresponding to the depth plane associated with a particular waveguide. In some embodiments, a single one of the image injection devices 360, 370, 380, 390, 400 may be associated with and inject light into a plurality (e.g., three) of the waveguides 270, 280, 290, 300, 310.

In some embodiments, the image injection devices 360, 370, 380, 390, 400 are discrete displays that each produce image information for injection into a corresponding waveguide 270, 280, 290, 300, 310, respectively. In some other embodiments, the image injection devices 360, 370, 380, 390, 400 are the output ends of a single multiplexed display which may, e.g., pipe image information via one or more optical conduits (such as fiber optic cables) to each of the image injection devices 360, 370, 380, 390, 400. It will be appreciated that the image information provided by the image injection devices 360, 370, 380, 390, 400 may include light of different wavelengths, or colors (e.g., different component colors, as discussed herein).

In some embodiments, the light injected into the waveguides 270, 280, 290, 300, 310 is provided by a light projector system 520, which comprises a light module 530, which may include a light emitter, such as a light emitting diode (LED). The light from the light module 530 may be directed to and modified by a light modulator 540, e.g., a spatial light modulator, via a beam splitter 550. The light modulator 540 may be configured to change the perceived intensity of the light injected into the waveguides 270, 280, 290, 300, 310 to encode the light with image information. Examples of spatial light modulators include liquid crystal displays (LCD) including a liquid crystal on silicon (LCOS) displays. It will be appreciated that the image injection devices 360, 370, 380, 390, 400 are illustrated schematically and, in some embodiments, these image injection devices may represent different light paths and locations in a common projection system configured to output light into associated ones of the waveguides 270, 280, 290, 300, 310. In some embodiments, the waveguides of the waveguide assembly 260 may function as ideal lens while relaying light injected into the waveguides out to the user's eyes. In this conception, the object may be the spatial light modulator 540 and the image may be the image on the depth plane.

In some embodiments, the display system 250 may be a scanning fiber display comprising one or more scanning fibers configured to project light in various patterns (e.g., raster scan, spiral scan, Lissajous patterns, etc.) into one or more waveguides 270, 280, 290, 300, 310 and ultimately to the eye 210 of the viewer. In some embodiments, the illustrated image injection devices 360, 370, 380, 390, 400 may schematically represent a single scanning fiber or a bundle of scanning fibers configured to inject light into one or a plurality of the waveguides 270, 280, 290, 300, 310. In some other embodiments, the illustrated image injection devices 360, 370, 380, 390, 400 may schematically represent a plurality of scanning fibers or a plurality of bundles of scanning fibers, each of which are configured to inject light into an associated one of the waveguides 270, 280, 290, 300, 310. It will be appreciated that one or more optical fibers may be configured to transmit light from the light module 530 to the one or more waveguides 270, 280, 290, 300, 310. It will be appreciated that one or more intervening optical structures may be provided between the scanning fiber, or fibers, and the one or more waveguides 270, 280, 290, 300, 310 to, e.g., redirect light exiting the scanning fiber into the one or more waveguides 270, 280, 290, 300, 310.

A controller 560 controls the operation of one or more of the stacked waveguide assembly 260, including operation of the image injection devices 360, 370, 380, 390, 400, the light source 530, and the light modulator 540. In some embodiments, the controller 560 is part of the local data processing module 140. The controller 560 includes programming (e.g., instructions in a non-transitory medium) that regulates the timing and provision of image information to the waveguides 270, 280, 290, 300, 310 according to, e.g., any of the various schemes disclosed herein. In some embodiments, the controller may be a single integral device, or a distributed system connected by wired or wireless communication channels. The controller 560 may be part of the processing modules 140 or 150 (FIG. 9D) in some embodiments.

With continued reference to FIG. 6, the waveguides 270, 280, 290, 300, 310 may be configured to propagate light within each respective waveguide by total internal reflection (TIR). The waveguides 270, 280, 290, 300, 310 may each be planar or have another shape (e.g., curved), with major top and bottom surfaces and edges extending between those major top and bottom surfaces. In the illustrated configuration, the waveguides 270, 280, 290, 300, 310 may each include out-coupling optical elements 570, 580, 590, 600, 610 that are configured to extract light out of a waveguide by redirecting the light, propagating within each respective waveguide, out of the waveguide to output image information to the eye 210. Extracted light may also be referred to as out-coupled light and the out-coupling optical elements light may also be referred to light extracting optical elements. An extracted beam of light may be outputted by the waveguide at locations at which the light propagating in the waveguide strikes a light extracting optical element. The out-coupling optical elements 570, 580, 590, 600, 610 may, for example, be gratings, including diffractive optical features, as discussed further herein. While illustrated disposed at the bottom major surfaces of the waveguides 270, 280, 290, 300, 310, for ease of description and drawing clarity, in some embodiments, the out-coupling optical elements 570, 580, 590, 600, 610 may be disposed at the top and/or bottom major surfaces, and/or may be disposed directly in the volume of the waveguides 270, 280, 290, 300, 310, as discussed further herein. In some embodiments, the out-coupling optical elements 570, 580, 590, 600, 610 may be formed in a layer of material that is attached to a transparent substrate to form the waveguides 270, 280, 290, 300, 310. In some other embodiments, the waveguides 270, 280, 290, 300, 310 may be a monolithic piece of material and the out-coupling optical elements 570, 580, 590, 600, 610 may be formed on a surface and/or in the interior of that piece of material.

With continued reference to FIG. 6, as discussed herein, each waveguide 270, 280, 290, 300, 310 is configured to output light to form an image corresponding to a particular depth plane. For example, the waveguide 270 nearest the eye may be configured to deliver collimated light (which was injected into such waveguide 270), to the eye 210. The collimated light may be representative of the optical infinity focal plane. The next waveguide up 280 may be configured to send out collimated light which passes through the first lens 350 (e.g., a negative lens) before it may reach the eye 210; such first lens 350 may be configured to create a slight convex wavefront curvature so that the eye/brain interprets light coming from that next waveguide up 280 as coming from a first focal plane closer inward toward the eye 210 from optical infinity. Similarly, the third up waveguide 290 passes its output light through both the first 350 and second 340 lenses before reaching the eye 210; the combined optical power of the first 350 and second 340 lenses may be configured to create another incremental amount of wavefront curvature so that the eye/brain interprets light coming from the third waveguide 290 as coming from a second focal plane that is even closer inward toward the person from optical infinity than was light from the next waveguide up 280.

The other waveguide layers 300, 310 and lenses 330, 320 are similarly configured, with the highest waveguide 310 in the stack sending its output through all of the lenses between it and the eye for an aggregate focal power representative of the closest focal plane to the person. To compensate for the stack of lenses 320, 330, 340, 350 when viewing/interpreting light coming from the world 510 on the other side of the stacked waveguide assembly 260, a compensating lens layer 620 may be disposed at the top of the stack to compensate for the aggregate power of the lens stack 320, 330, 340, 350 below. Such a configuration provides as many perceived focal planes as there are available waveguide/lens pairings. Both the out-coupling optical elements of the waveguides and the focusing aspects of the lenses may be static (i.e., not dynamic or electro-active). In some alternative embodiments, either or both may be dynamic using electro-active features.

In some embodiments, two or more of the waveguides 270, 280, 290, 300, 310 may have the same associated depth plane. For example, multiple waveguides 270, 280, 290, 300, 310 may be configured to output images set to the same depth plane, or multiple subsets of the waveguides 270, 280, 290, 300, 310 may be configured to output images set to the same plurality of depth planes, with one set for each depth plane. This may provide advantages for forming a tiled image to provide an expanded field of view at those depth planes.

With continued reference to FIG. 6, the out-coupling optical elements 570, 580, 590, 600, 610 may be configured to both redirect light out of their respective waveguides and to output this light with the appropriate amount of divergence or collimation for a particular depth plane associated with the waveguide. As a result, waveguides having different associated depth planes may have different configurations of out-coupling optical elements 570, 580, 590, 600, 610, which output light with a different amount of divergence depending on the associated depth plane. In some embodiments, the light extracting optical elements 570, 580, 590, 600, 610 may be volumetric or surface features, which may be configured to output light at specific angles. For example, the light extracting optical elements 570, 580, 590, 600, 610 may be volume holograms, surface holograms, and/or diffraction gratings. In some embodiments, the features 320, 330, 340, 350 may not be lenses; rather, they may simply be spacers (e.g., cladding layers and/or structures for forming air gaps).

In some embodiments, the out-coupling optical elements 570, 580, 590, 600, 610 are diffractive features that form a diffraction pattern, or "diffractive optical element" (also referred to herein as a "DOE"). Preferably, the DOE's have a sufficiently low diffraction efficiency so that only a portion of the light of the beam is deflected away toward the eye 210 with each intersection of the DOE, while the rest continues to move through a waveguide via TIR. The light carrying the image information is thus divided into a number of related exit beams that exit the waveguide at a multiplicity of locations and the result is a fairly uniform pattern of exit emission toward the eye 210 for this particular collimated beam bouncing around within a waveguide.

In some embodiments, one or more DOEs may be switchable between "on" states in which they actively diffract, and "off" states in which they do not significantly diffract. For instance, a switchable DOE may comprise a layer of polymer dispersed liquid crystal, in which microdroplets comprise a diffraction pattern in a host medium, and the refractive index of the microdroplets may be switched to substantially match the refractive index of the host material (in which case the pattern does not appreciably diffract incident light) or the microdroplet may be switched to an index that does not match that of the host medium (in which case the pattern actively diffracts incident light).

In some embodiments, a camera assembly 630 (e.g., a digital camera, including visible light and infrared light cameras) may be provided to capture images of the eye 210 and/or tissue around the eye 210 to, e.g., detect user inputs and/or to monitor the physiological state of the user. As used herein, a camera may be any image capture device. In some embodiments, the camera assembly 630 may include an image capture device and a light source to project light (e.g., infrared light) to the eye, which may then be reflected by the eye and detected by the image capture device. In some embodiments, the camera assembly 630 may be attached to the frame 80 (FIG. 9D) and may be in electrical communication with the processing modules 140 and/or 150, which may process image information from the camera assembly 630. In some embodiments, one camera assembly 630 may be utilized for each eye, to separately monitor each eye.

Figure 7:
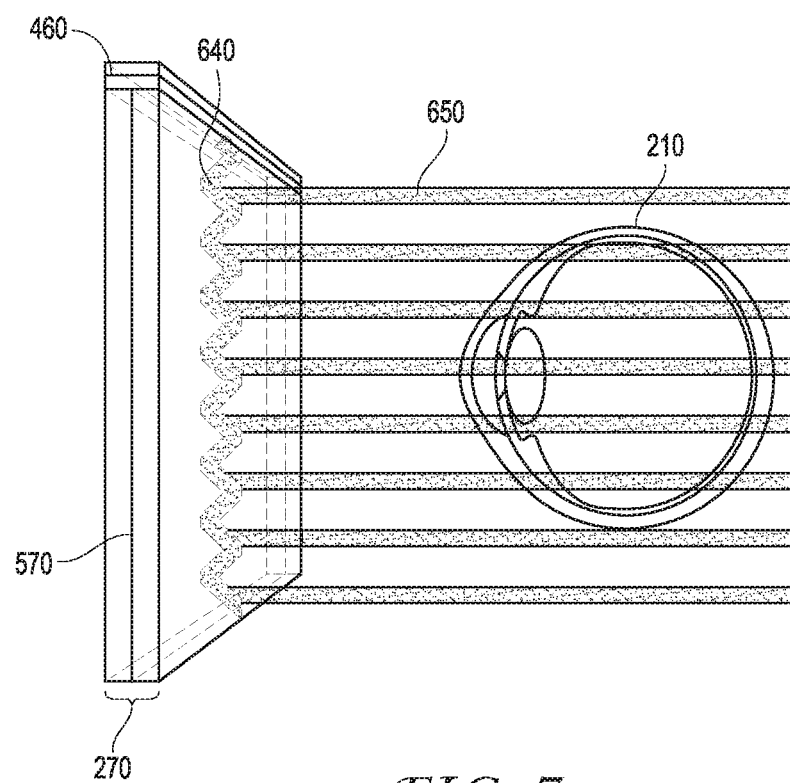
FIG. 7 illustrates an example of exit beams outputted by a waveguide.

With reference now to FIG. 7, an example of exit beams outputted by a waveguide is shown. One waveguide is illustrated, but it will be appreciated that other waveguides in the waveguide assembly 260 (FIG. 6) may function similarly, where the waveguide assembly 260 includes multiple waveguides. Light 640 is injected into the waveguide 270 at the input surface 460 of the waveguide 270 and propagates within the waveguide 270 by TIR. At points where the light 640 impinges on the DOE 570, a portion of the light exits the waveguide as exit beams 650. The exit beams 650 are illustrated as substantially parallel but, as discussed herein, they may also be redirected to propagate to the eye 210 at an angle (e.g., forming divergent exit beams), depending on the depth plane associated with the waveguide 270. It will be appreciated that substantially parallel exit beams may be indicative of a waveguide with out-coupling optical elements that out-couple light to form images that appear to be set on a depth plane at a large distance (e.g., optical infinity) from the eye 210. Other waveguides or other sets of out-coupling optical elements may output an exit beam pattern that is more divergent, which would require the eye 210 to accommodate to a closer distance to bring it into focus on the retina and would be interpreted by the brain as light from a distance closer to the eye 210 than optical infinity.

Figure 8:
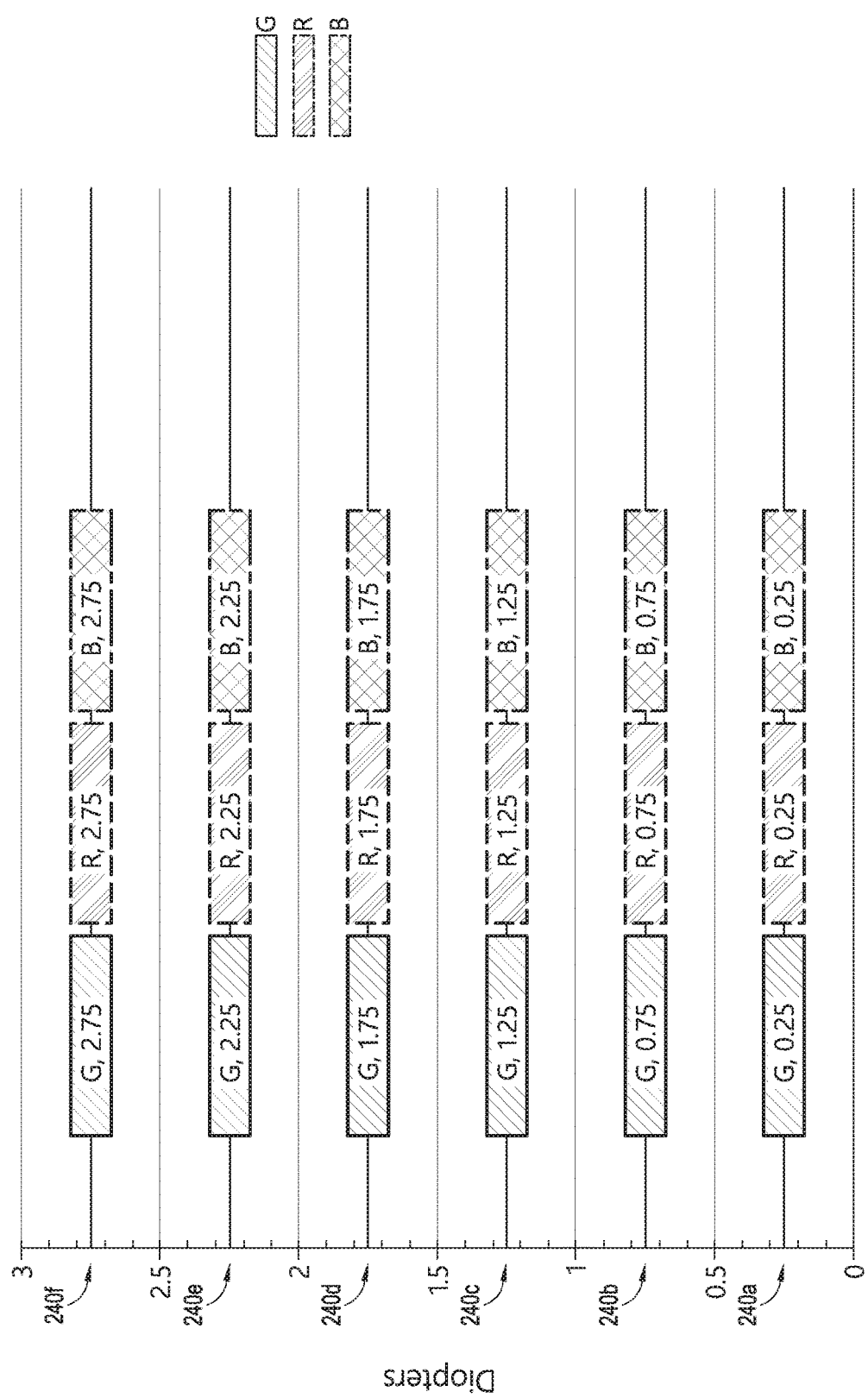
FIG. 8 illustrates an example of a stacked waveguide assembly in which each depth plane includes images formed using multiple different component colors.

In some embodiments, a full color image may be formed at each depth plane by overlaying images in each of the component colors, e.g., three or more component colors. FIG. 8 illustrates an example of a stacked waveguide assembly in which each depth plane includes images formed using multiple different component colors. The illustrated embodiment shows depth planes 240a-240f, although more or fewer depths are also contemplated. Each depth plane may have three or more component color images associated with it, including: a first image of a first color, G; a second image of a second color, R; and a third image of a third color, B. Different depth planes are indicated in the figure by different numbers for diopters (dpt) following the letters G, R, and B. Just as examples, the numbers following each of these letters indicate diopters (1/m), or inverse distance of the depth plane from a viewer, and each box in the figures represents an individual component color image. In some embodiments, to account for differences in the eye's focusing of light of different wavelengths, the exact placement of the depth planes for different component colors may vary. For example, different component color images for a given depth plane may be placed on depth planes corresponding to different distances from the user. Such an arrangement may increase visual acuity and user comfort and/or may decrease chromatic aberrations.

In some embodiments, light of each component color may be outputted by a single dedicated waveguide and, consequently, each depth plane may have multiple waveguides associated with it. In such embodiments, each box in the figures including the letters G, R, or B may be understood to represent an individual waveguide, and three waveguides may be provided per depth plane where three component color images are provided per depth plane. While the waveguides associated with each depth plane are shown adjacent to one another in this drawing for ease of description, it will be appreciated that, in a physical device, the waveguides may all be arranged in a stack with one waveguide per level. In some other embodiments, multiple component colors may be outputted by the same waveguide, such that, e.g., only a single waveguide may be provided per depth plane.

With continued reference to FIG. 8, in some embodiments, G is the color green, R is the color red, and B is the color blue. In some other embodiments, other colors associated with other wavelengths of light, including magenta and cyan, may be used in addition to or may replace one or more of red, green, or blue.

It will be appreciated that references to a given color of light throughout this disclosure will be understood to encompass light of one or more wavelengths within a range of wavelengths of light that are perceived by a viewer as being of that given color. For example, red light may include light of one or more wavelengths in the range of about 620-780 nm, green light may include light of one or more wavelengths in the range of about 492-577 nm, and blue light may include light of one or more wavelengths in the range of about 435-493 nm.

In some embodiments, the light source 530 (FIG. 6) may be configured to emit light of one or more wavelengths outside the visual perception range of the viewer, for example, infrared and/or ultraviolet wavelengths. In addition, the in-coupling, out-coupling, and other light redirecting structures of the waveguides of the display 250 may be configured to direct and emit this light out of the display towards the user's eye 210, e.g., for imaging and/or user stimulation applications.

Figure 9A:
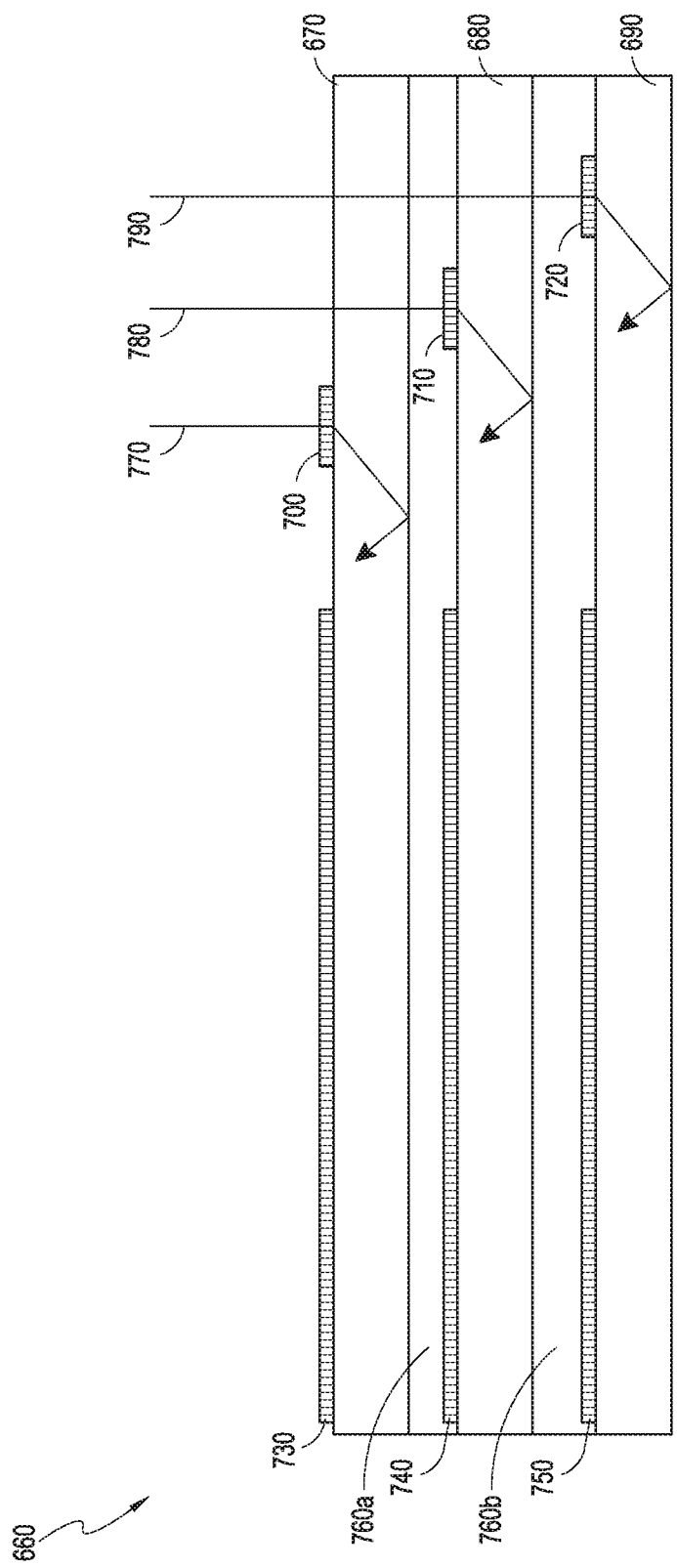
FIG. 9A illustrates a cross-sectional side view of an example of a set of stacked waveguides that each includes an incoupling optical element.

With reference now to FIG. 9A, in some embodiments, light impinging on a waveguide may need to be redirected to in-couple that light into the waveguide. An in-coupling optical element may be used to redirect and in-couple the light into its corresponding waveguide. FIG. 9A illustrates a cross-sectional side view of an example of a plurality or set 660 of stacked waveguides that each includes an in-coupling optical element. The waveguides may each be configured to output light of one or more different wavelengths, or one or more different ranges of wavelengths. It will be appreciated that the stack 660 may correspond to the stack 260 (FIG. 6) and the illustrated waveguides of the stack 660 may correspond to part of the plurality of waveguides 270, 280, 290, 300, 310, except that light from one or more of the image injection devices 360, 370, 380, 390, 400 is injected into the waveguides from a position that requires light to be redirected for in-coupling.

The illustrated set 660 of stacked waveguides includes waveguides 670, 680, and 690. Each waveguide includes an associated in-coupling optical element (which may also be referred to as a light input area on the waveguide), with, e.g., in-coupling optical element 700 disposed on a major surface (e.g., an upper major surface) of waveguide 670, in-coupling optical element 710 disposed on a major surface (e.g., an upper major surface) of waveguide 680, and in-coupling optical element 720 disposed on a major surface (e.g., an upper major surface) of waveguide 690. In some embodiments, one or more of the in-coupling optical elements 700, 710, 720 may be disposed on the bottom major surface of the respective waveguide 670, 680, 690 (particularly where the one or more in-coupling optical elements are reflective, deflecting optical elements). As illustrated, the in-coupling optical elements 700, 710, 720 may be disposed on the upper major surface of their respective waveguide 670, 680, 690 (or the top of the next lower waveguide), particularly where those in-coupling optical elements are transmissive, deflecting optical elements. In some embodiments, the in-coupling optical elements 700, 710, 720 may be disposed in the body of the respective waveguide 670, 680, 690. In some embodiments, as discussed herein, the in-coupling optical elements 700, 710, 720 are wavelength selective, such that they selectively redirect one or more wavelengths of light, while transmitting other wavelengths of light. While illustrated on one side or corner of their respective waveguide 670, 680, 690, it will be appreciated that the in-coupling optical elements 700, 710, 720 may be disposed in other areas of their respective waveguide 670, 680, 690 in some embodiments.

As illustrated, the in-coupling optical elements 700, 710, 720 may be laterally offset from one another. In some embodiments, each in-coupling optical element may be offset such that it receives light without that light passing through another in-coupling optical element. For example, each in-coupling optical element 700, 710, 720 may be configured to receive light from a different image injection device 360, 370, 380, 390, and 400 as shown in FIG. 6, and may be separated (e.g., laterally spaced apart) from other in-coupling optical elements 700, 710, 720 such that it substantially does not receive light from the other ones of the in-coupling optical elements 700, 710, 720.

Each waveguide also includes associated light distributing elements, with, e.g., light distributing elements 730 disposed on a major surface (e.g., a top major surface) of waveguide 670, light distributing elements 740 disposed on a major surface (e.g., a top major surface) of waveguide 680, and light distributing elements 750 disposed on a major surface (e.g., a top major surface) of waveguide 690. In some other embodiments, the light distributing elements 730, 740, 750, may be disposed on a bottom major surface of associated waveguides 670, 680, 690, respectively. In some other embodiments, the light distributing elements 730, 740, 750, may be disposed on both top and bottom major surface of associated waveguides 670, 680, 690, respectively; or the light distributing elements 730, 740, 750, may be disposed on different ones of the top and bottom major surfaces in different associated waveguides 670, 680, 690, respectively.

The waveguides 670, 680, 690 may be spaced apart and separated by, e.g., gas, liquid, and/or solid layers of material. For example, as illustrated, layer 760*a* may separate waveguides 670 and 680; and layer 760*b* may separate waveguides 680 and 690. In some embodiments, the layers 760*a* and 760*b* are formed of low refractive index materials (that is, materials having a lower refractive index than the material forming the immediately adjacent one of waveguides 670, 680, 690). Preferably, the refractive index of the material forming the layers 760*a*, 760*b* is 0.05 or more, or 0.10 or less than the refractive index of the material forming the waveguides 670, 680, 690. Advantageously, the lower refractive index layers 760*a*, 760*b* may function as cladding layers that facilitate total internal reflection (TIR) of light through the waveguides 670, 680, 690 (e.g., TIR between the top and bottom major surfaces of each waveguide). In some embodiments, the layers 760*a*, 760*b* are formed of air. While not illustrated, it will be appreciated that the top and bottom of the illustrated set 660 of waveguides may include immediately neighboring cladding layers.

Preferably, for ease of manufacturing and other considerations, the material forming the waveguides 670, 680, 690 are similar or the same, and the material forming the layers 760*a*, 760*b* are similar or the same. In some embodiments, the material forming the waveguides 670, 680, 690 may be different between one or more waveguides, and/or the material forming the layers 760*a*, 760*b* may be different, while still holding to the various refractive index relationships noted above.

With continued reference to FIG. 9A, light rays 770, 780, 790 are incident on the set 660 of waveguides. It will be appreciated that the light rays 770, 780, 790 may be injected into the waveguides 670, 680, 690 by one or more image injection devices 360, 370, 380, 390, 400 (FIG. 6).

In some embodiments, the light rays 770, 780, 790 have different properties, e.g., different wavelengths or different ranges of wavelengths, which may correspond to different colors. The in-coupling optical elements 700, 710, 720 each deflect the incident light such that the light propagates through a respective one of the waveguides 670, 680, 690 by TIR. In some embodiments, the incoupling optical elements 700, 710, 720 each selectively deflect one or more particular wavelengths of light, while transmitting other wavelengths to an underlying waveguide and associated incoupling optical element.

For example, in-coupling optical element 700 may be configured to deflect ray 770, which has a first wavelength or range of wavelengths, while transmitting rays 780 and 790, which have different second and third wavelengths or ranges of wavelengths, respectively. The transmitted ray 780 impinges on and is deflected by the in-coupling optical element 710, which is configured to deflect light of a second wavelength or range of wavelengths. The ray 790 is deflected by the in-coupling optical element 720, which is configured to selectively deflect light of third wavelength or range of wavelengths.

With continued reference to FIG. 9A, the deflected light rays 770, 780, 790 are deflected so that they propagate through a corresponding waveguide 670, 680, 690; that is, the in-coupling optical elements 700, 710, 720 of each waveguide deflects light into that corresponding waveguide 670, 680, 690 to in-couple light into that corresponding waveguide. The light rays 770, 780, 790 are deflected at angles that cause the light to propagate through the respective waveguide 670, 680, 690 by TIR. The light rays 770, 780, 790 propagate through the respective waveguide 670, 680, 690 by TIR until impinging on the waveguide's corresponding light distributing elements 730, 740, 750.

Figure 9B:
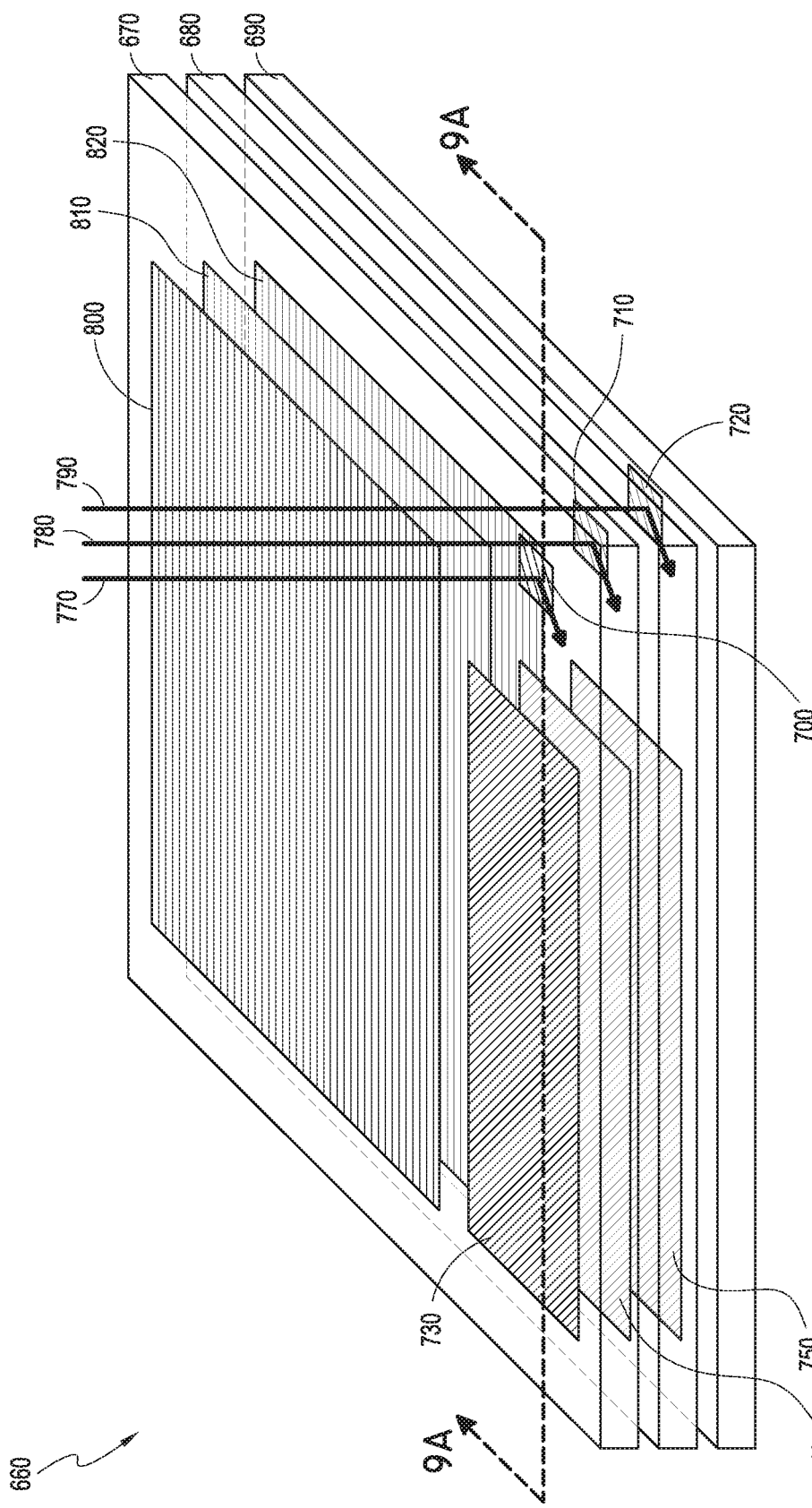
FIG. 9B illustrates a perspective view of an example of the plurality of stacked waveguides of FIG. 9A.

With reference now to FIG. 9B, a perspective view of an example of the plurality of stacked waveguides of FIG. 9A is illustrated. As noted above, the in-coupled light rays 770, 780, 790, are deflected by the in-coupling optical elements 700, 710, 720, respectively, and then propagate by TIR within the waveguides 670, 680, 690, respectively. The light rays 770, 780, 790 then impinge on the light distributing elements 730, 740, 750, respectively. The light distributing elements 730, 740, 750 deflect the light rays 770, 780, 790 so that they propagate towards the out-coupling optical elements 800, 810, 820, respectively.

In some embodiments, the light distributing elements 730, 740, 750 are orthogonal pupil expanders (OPE's). In some embodiments, the OPE's deflect or distribute light to the out-coupling optical elements 800, 810, 820 and, in some embodiments, may also increase the beam or spot size of this light as it propagates to the out-coupling optical elements. In some embodiments, the light distributing elements 730, 740, 750 may be omitted and the in-coupling optical elements 700, 710, 720 may be configured to deflect light directly to the out-coupling optical elements 800, 810, 820. For example, with reference to FIG. 9A, the light distributing elements 730, 740, 750 may be replaced with out-coupling optical elements 800, 810, 820, respectively. In some embodiments, the out-coupling optical elements 800, 810, 820 are exit pupils (EP's) or exit pupil expanders (EPE's) that direct light in a viewer's eye 210 (FIG. 7). It will be appreciated that the OPE's may be configured to increase the dimensions of the eye box in at least one axis and the EPE's may be to increase the eye box in an axis crossing, e.g., orthogonal to, the axis of the OPEs. For example, each OPE may be configured to redirect a portion of the light striking the OPE to an EPE of the same waveguide, while allowing the remaining portion of the light to continue to propagate down the waveguide. Upon impinging on the OPE again, another portion of the remaining light is redirected to the EPE, and the remaining portion of that portion continues to propagate further down the waveguide, and so on. Similarly, upon striking the EPE, a portion of the impinging light is directed out of the waveguide towards the user, and a remaining portion of that light continues to propagate through the waveguide until it strikes the EP again, at which time another portion of the impinging light is directed out of the waveguide, and so on. Consequently, a single beam of incoupled light may be "replicated" each time a portion of that light is redirected by an OPE or EPE, thereby forming a field of cloned beams of light, as shown in FIG. 6. In some embodiments, the OPE and/or EPE may be configured to modify a size of the beams of light.

Accordingly, with reference to FIGS. 9A and 9B, in some embodiments, the set 660 of waveguides includes waveguides 670, 680, 690; in-coupling optical elements 700, 710, 720; light distributing elements (e.g., OPE's) 730, 740, 750; and out-coupling optical elements (e.g., EP's) 800, 810, 820 for each component color. The waveguides 670, 680, 690 may be stacked with an air gap/cladding layer between each one. The in-coupling optical elements 700, 710, 720 redirect or deflect incident light (with different in-coupling optical elements receiving light of different wavelengths) into its waveguide. The light then propagates at an angle which will result in TIR within the respective waveguide 670, 680, 690. In the example shown, light ray 770 (e.g., blue light) is deflected by the first in-coupling optical element 700, and then continues to bounce down the waveguide, interacting with the light distributing element (e.g., OPE's) 730 and then the out-coupling optical element (e.g., EPs) 800, in a manner described earlier. The light rays 780 and 790 (e.g., green and red light, respectively) will pass through the waveguide 670, with light ray 780 impinging on and being deflected by in-coupling optical element 710. The light ray 780 then bounces down the waveguide 680 via TIR, proceeding on to its light distributing element (e.g., OPEs) 740 and then the out-coupling optical element (e.g., EP's) 810. Finally, light ray 790 (e.g., red light) passes through the waveguide 690 to impinge on the light in-coupling optical elements 720 of the waveguide 690. The light in-coupling optical elements 720 deflect the light ray 790 such that the light ray propagates to light distributing element (e.g., OPEs) 750 by TIR, and then to the out-coupling optical element (e.g., EPs) 820 by TIR. The out-coupling optical element 820 then finally out-couples the light ray 790 to the viewer, who also receives the out-coupled light from the other waveguides 670, 680.

Figure 9C:
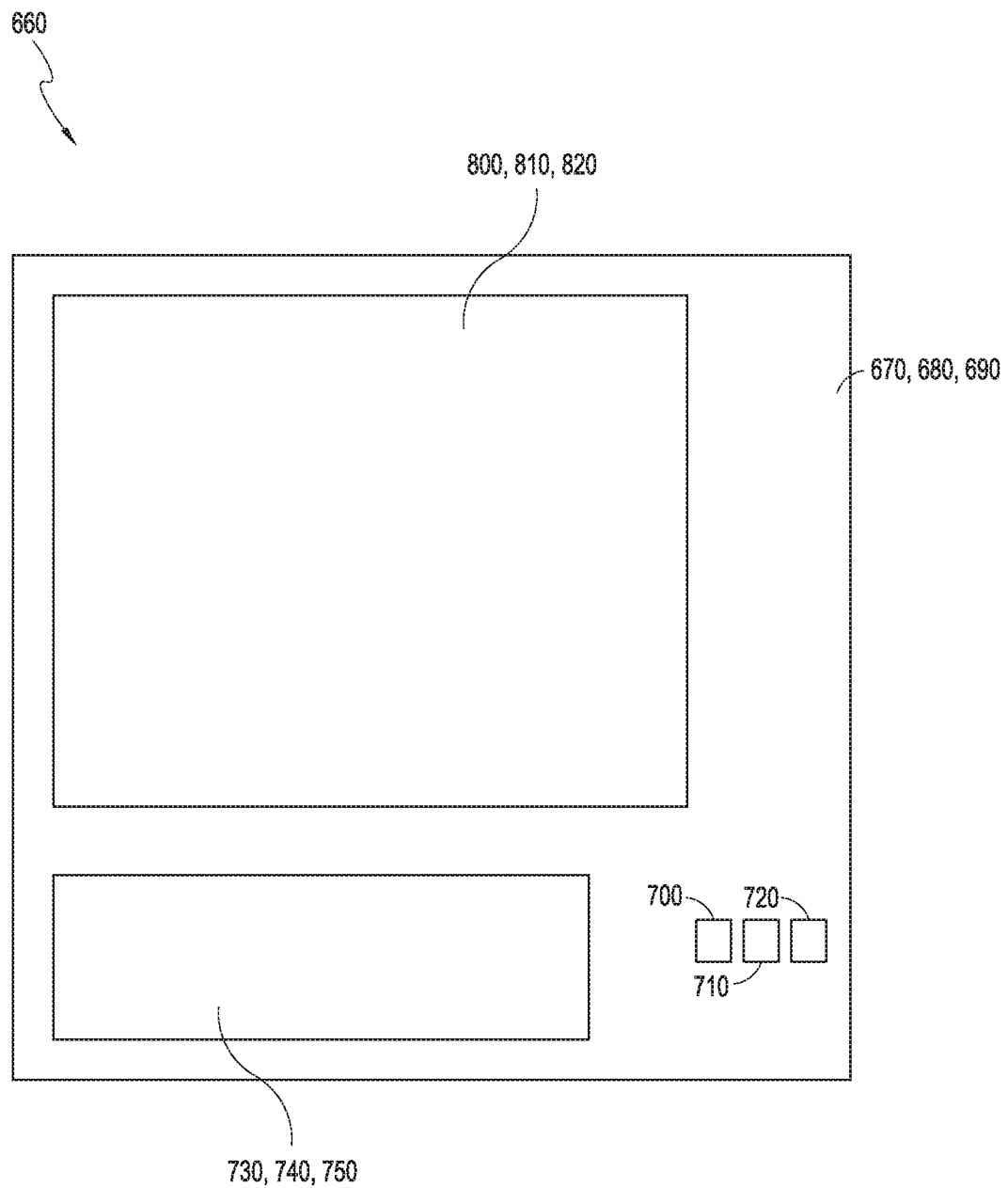
FIG. 9C illustrates a top-down plan view of an example of the plurality of stacked waveguides of FIGS. 9A and 9B.

FIG. 9C illustrates a top-down plan view of an example of the plurality of stacked waveguides of FIGS. 9A and 9B. As illustrated, the waveguides 670, 680, 690, along with each waveguide's associated light distributing element 730, 740, 750 and associated out-coupling optical element 800, 810, 820, may be vertically aligned. However, as discussed herein, the in-coupling optical elements 700, 710, 720 are not vertically aligned; rather, the in-coupling optical elements are preferably non-overlapping (e.g., laterally spaced apart as seen in the top-down view). As discussed further herein, this nonoverlapping spatial arrangement facilitates the injection of light from different resources into different waveguides on a one-to-one basis, thereby allowing a specific light source to be uniquely coupled to a specific waveguide. In some embodiments, arrangements including nonoverlapping spatially-separated in-coupling optical elements may be referred to as a shifted pupil system, and the in-coupling optical elements within these arrangements may correspond to sub pupils.

Figure 9D:
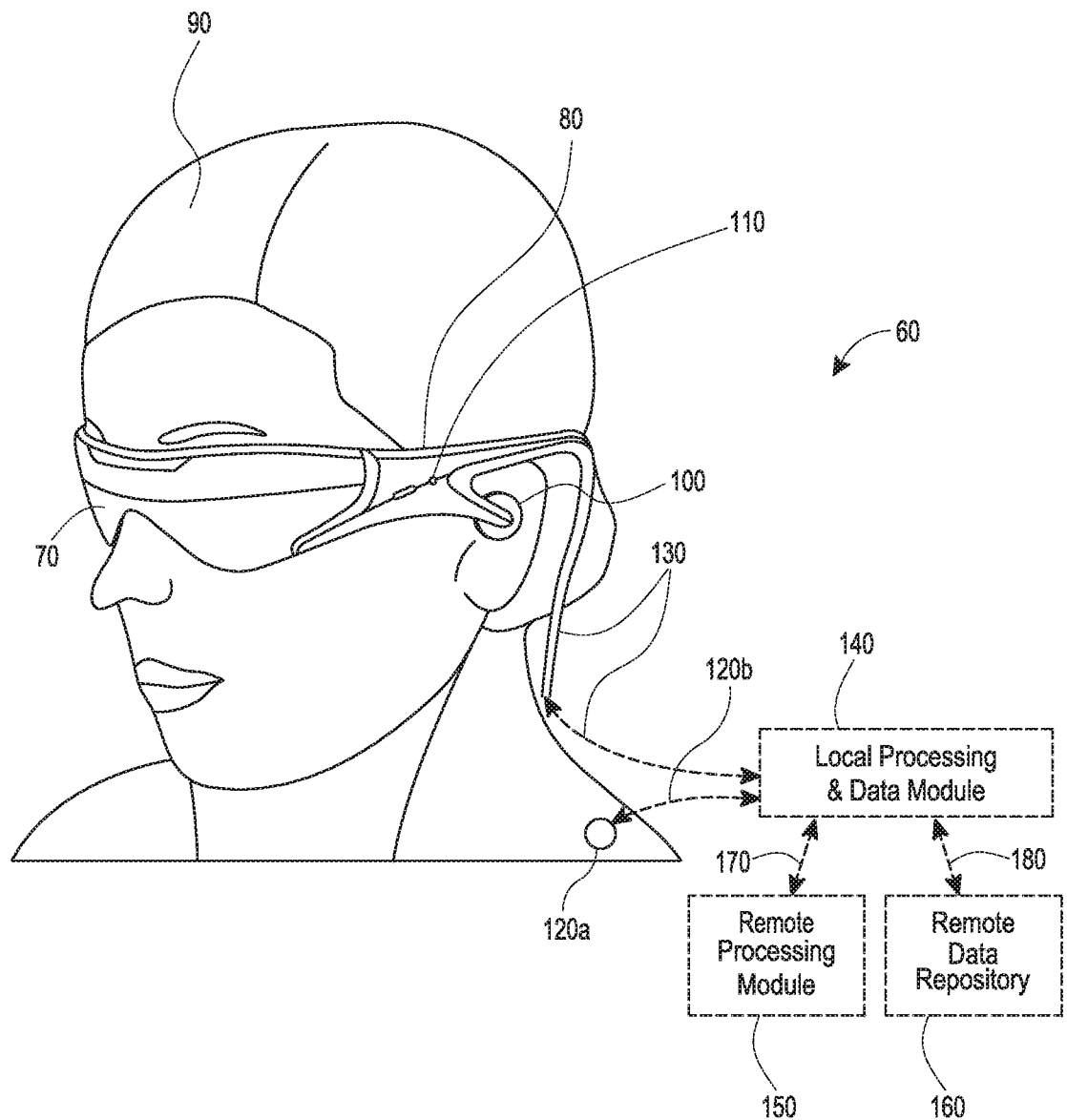
FIG. 9D illustrates an example of wearable display system.

FIG. 9D illustrates an example of wearable display system 60 into which the various waveguides and related systems disclosed herein may be integrated. In some embodiments, the display system 60 is the system 250 of FIG. 6, with FIG. 6 schematically showing some parts of that system 60 in greater detail. For example, the waveguide assembly 260 of FIG. 6 may be part of the display 70.

With continued reference to FIG. 9D, the display system 60 includes a display 70, and various mechanical and electronic modules and systems to support the functioning of that display 70. The display 70 may be coupled to a frame 80, which is wearable by a display system user or viewer 90 and which is configured to position the display 70 in front of the eyes of the user 90. The display 70 may be considered eyewear in some embodiments. In some embodiments, a speaker 100 is coupled to the frame 80 and configured to be positioned adjacent the ear canal of the user 90 (in some embodiments, another speaker, not shown, may optionally be positioned adjacent the other ear canal of the user to provide stereo/shapeable sound control). The display system 60 may also include one or more microphones 110 or other devices to detect sound. In some embodiments, the microphone is configured to allow the user to provide inputs or commands to the system 60 (e.g., the selection of voice menu commands, natural language questions, etc.), and/or may allow audio communication with other persons (e.g., with other users of similar display systems. The microphone may further be configured as a peripheral sensor to collect audio data (e.g., sounds from the user and/or environment). In some embodiments, the display system may also include a peripheral sensor 120a, which may be separate from the frame 80 and attached to the body of the user 90 (e.g., on the head, torso, an extremity, etc. of the user 90). The peripheral sensor 120a may be configured to acquire data characterizing a physiological state of the user 90 in some embodiments. For example, the sensor 120a may be an electrode.

With continued reference to FIG. 9D, the display 70 is operatively coupled by communications link 130, such as by a wired lead or wireless connectivity, to a local data processing module 140 which may be mounted in a variety of configurations, such as fixedly attached to the frame 80, fixedly attached to a helmet or hat worn by the user, embedded in headphones, or otherwise removably attached to the user 90 (e.g., in a backpack-style configuration, in a belt-coupling style configuration). Similarly, the sensor 120a may be operatively coupled by communications link 120b, e.g., a wired lead or wireless connectivity, to the local processor and data module 140. The local processing and data module 140 may comprise a hardware processor, as well as digital memory, such as non-volatile memory (e.g., flash memory or hard disk drives), both of which may be utilized to assist in the processing, caching, and storage of data. Optionally, the local processor and data module 140 may include one or more central processing units (CPUs), graphics processing units (GPUs), dedicated processing hardware, and so on. The data may include data a) captured from sensors (which may be, e.g., operatively coupled to the frame 80 or otherwise attached to the user 90), such as image capture devices (such as cameras), microphones, inertial measurement units, accelerometers, compasses, GPS units, radio devices, gyros, and/or other sensors disclosed herein; and/or b) acquired and/or processed using remote processing module 150 and/or remote data repository 160 (including data relating to virtual content), possibly for passage to the display 70 after such processing or retrieval. The local processing and data module 140 may be operatively coupled by communication links 170, 180, such as via a wired or wireless communication links, to the remote processing module 150 and remote data repository 160 such that these remote modules 150, 160 are operatively coupled to each other and available as resources to the local processing and data module 140. In some embodiments, the local processing and data module 140 may include one or more of the image capture devices, microphones, inertial measurement units, accelerometers, compasses, GPS units, radio devices, and/or gyros. In some other embodiments, one or more of these sensors may be attached to the frame 80, or may be standalone structures that communicate with the local processing and data module 140 by wired or wireless communication pathways.

With continued reference to FIG. 9D, in some embodiments, the remote processing module 150 may comprise one or more processors configured to analyze and process data and/or image information, for instance including one or more central processing units (CPUs), graphics processing units (GPUs), dedicated processing hardware, and so on. In some embodiments, the remote data repository 160 may comprise a digital data storage facility, which may be available through the internet or other networking configuration in a "cloud" resource configuration. In some embodiments, the remote data repository 160 may include one or more remote servers, which provide information, e.g., information for generating augmented reality content, to the local processing and data module 140 and/or the remote processing module 150. In some embodiments, all data is stored and all computations are performed in the local processing and data module, allowing fully autonomous use from a remote module. Optionally, an outside system (e.g., a system of one or more processors, one or more computers) that includes CPUs, GPUs, and so on, may perform at least a portion of processing (e.g., generating image information, processing data) and provide information to, and receive information from, modules 140, 150, 160, for instance via wireless or wired connections.

High Index Waveguides and Optical Elements for Displays Adapted for Wide Field of View Providing an immersive experience to a user of waveguide-based display systems, e.g., various semitransparent or transparent display systems configured for virtual/augmented/mixed display applications described supra, depends on, among other things, various characteristics of the light coupling into the waveguides of the display systems described herein. For example, a virtual/augmented/mixed display having a relatively high field of view (FOV) can enhance the viewing experience. The FOV of the display depends on the angle of light output by waveguides of the eyepiece, through which the viewer sees images projected into his or her eye. The angle of light output from the waveguides can in turn depend, at least in part, on the range of angles that can be supported by the waveguide. As discussed above, in-coupling optical elements such as in-coupling diffraction gratings may be employed to couple light into the waveguides by altering the direction in which the light travels such that the light can propagate by total internal reflection within the waveguide. Generally, light within a finite range of angles can be coupled into the waveguides through the in-coupling optical elements such as a grating. The limited range of angles can be defined by a critical angle, which can depend on, among other things, the index of refraction of the substrate material. Generally, higher index of refraction may give rise to a larger FOV. A smaller angle of acceptance of light by the waveguides may also limit the range of angle output by the waveguide into the eye of the wearer, and thus potentially reduce the FOV for the wearer. A waveguide having a relatively high refractive index, e.g., 2.0 or greater, can provide a relatively high FOV.

Diffraction gratings can determine the efficiency of the coupling of the light into the waveguide. However, a low index diffraction grating may have a low efficiency at grazing angles, such that the effective FOV. Thus, to efficiently couple light into the high refractive index waveguide, the diffractive optical coupling elements should also have a correspondingly high refractive index. In the following, diffraction gratings having a relatively high (e.g., >2.0) refractive index of refraction, such as diffraction gratings based on Li-based oxide, and manufacturing methods thereof, are described, which can enable relatively wide field of view (FOV).

As described supra, e.g., in reference to FIGS. 6 and 7, display systems according to various embodiments described herein may include optical elements, e.g., in-coupling optical elements, out-coupling optical elements, and light distributing elements, which may include diffraction gratings. For example, as described above in reference to FIG. 7, light 640 that is injected into the waveguide 270 at the input surface 460 of the waveguide 270 propagates within the waveguide 270 by total internal reflection (TIR). At points where the light 640 impinges on the out-coupling optical element 570, a portion of the light exits the waveguide as beamlets 650. In some implementations, any of the optical elements 570, 580, 590, 600, 610 can be configured as a diffraction grating.

To achieve desirable characteristics of in-coupling of light into (or out-coupling of light from) the waveguides 270, 280, 290, 300, 310, the optical elements 570, 580, 590, 600, 610 configured as diffraction gratings can be formed of a suitable material, such as a photoresist or a grating pattern integrated with the substrate, and have a suitable structure for controlling various optical properties, including diffraction properties. The desirable diffraction properties include, among other properties, spectral selectivity, angular selectivity, polarization selectivity, high spectral bandwidth and high or graded diffraction efficiencies, and a wide field of view (FOV).

To achieve one or more of these and other advantages including relatively high FOV, various examples described herein include a waveguide comprising a relatively high index (e.g., greater than or equal to 2.0) material, such as a Li-based oxide, having formed thereon respective diffraction gratings with correspondingly high refractive index, such a Li-based oxide. For example, a diffraction grating may be formed directly on a Li-based oxide waveguide by patterning a surface portion of the waveguide formed of a Li-based oxide.

The diffraction gratings are configured to diffract visible and/or infrared light incident thereon into respective waveguides, such that light diffracted into the waveguides propagates within each of the waveguides, for example, by total internal reflection (TIR). The diffraction gratings are configured to diffract the light into the respective waveguides when the light is incident thereon within respective ranges of angles.

FIG. 10A illustrates a cross-sectional view of a portion of a display device 1000 comprising a high index waveguide 1004 and a high index diffraction grating 1008 comprising a Li-based oxide formed on the waveguide 1004, according to some embodiments. The diffraction grating 1008 is configured to diffract light such that the light is guided within the waveguide 1004 by TIR. The waveguide 1004 can correspond to one of waveguides 670, 680, 690 described above with respect to FIGS. 9A-9C, for example. The diffraction grating 1008 can correspond to, e.g., an in-coupling optical element (700, 710, 720, FIGS. 9A-9C). The display device 1000 additionally includes an optical element such as light distributing elements 730, 740, 750 (see FIGS. 9A-9C), for example, or one of out-coupling optical elements (800, 810, 820, see FIGS. 9A-9C), for example.

In operation, when an incident light beam 1016, e.g., visible light, is incident on the diffraction grating 1008 comprising Li-based oxide at an angle of incidence a measured relative to a plane normal 1002 that is normal or orthogonal to the surface 1008S extending in the y-x plane, the diffraction grating 1008 comprising Li-based oxide at least partially diffracts the incident light beam 1016 as a diffracted light beam 1024 at a diffraction angle θ measured relative to the plane normal 1002, while at least partially transmitting the incident light as a transmitted light beam 1020. As described herein, a light beam that is incident at an angle in a clockwise direction relative to the plane normal 1002 (i.e., on the right side of the plane normal 1002) as in the illustrated embodiment is referred to as having a negative α (α<0), whereas a light beam that is incident at an angle in a counter-clockwise direction relative to the plane normal 1002 (i.e., on the left side of the plane normal) is referred to as having a positive α (α>0). When the diffracted light beam 1024 is diffracted at a diffraction angle θ that exceeds a critical angle $\theta_{TIR}$ for occurrence of total internal reflection in the waveguide 1004, the diffracted light beam 1024 propagates in the waveguide 1004 along the x-axis via total internal reflection (TIR) until the diffracted light beam 1024 reaches one of light distributing elements 730, 740, 750, for example, or one of out-coupling optical elements (800, 810, 820, FIGS. 9A-9C), for example.

As further described elsewhere in the specification, a suitable combination of high index material and the structure of the diffraction grating 1008 may be selected such that a particular range (Δα) of angle of incidence a, referred to herein as a range of angle of acceptance or a field-of-view (FOV), is obtained. According to various embodiments, the diffraction grating 1008 comprising Li-based oxide and the waveguide 1004 are arranged such that Δα exceeds 40 degrees (e.g., +/−20 degrees), 60 degrees (e.g., +/−30 degrees), 80 degrees (e.g., +/−40 degrees) or 100 degrees (e.g., +/−50 degrees), or is within a range of angles defined by any of these values, including symmetric and asymmetric ranges about the plane normal 1002, e.g., at 0 degrees. As described herein. the desired range Δα may be described by a range of angles spanning negative and/or positive values of a, outside of which the diffraction efficiency falls off by more than 10%, 25%, more than 50%, or more than 75%, relative to the diffraction efficiency at α=0. Having the Δα within the range in which the diffraction efficiency is relatively high and constant may be desirable, e.g., where a uniform intensity of diffracted light is desired within the Δα. Thus, the Δα is associated with the angular bandwidth of the diffraction grating 1008, such that the incident light beam 1016 within the Δα is efficiently diffracted by the diffraction grating 1008 at a diffraction angle θ with respect to the surface normal 1002 (e.g., the y-z plane) that exceeds $\theta_{TIR}$, and that the diffracted light propagates within the waveguide 1004 under total internal reflection (TIR). It will be appreciated that the Δα as described herein translates into the angle of reflection within the waveguide 1004 under total internal reflection and eventually the angle coupled out of the waveguide, and hence the field of view (FOV) experienced by the user.

In the following, in various embodiments, the diffraction grating 1008 is formed of a Li-based oxide comprising relatively high refractive index ($n_1$), which can be, e.g., greater than 2.0, 2.1, 2.2, 2.3, 2.4, 2.5, 2.6 or in any range defined by any of these values. According to various embodiments, $n_1$ may be greater than, equal to or less than the refractive index $n_2$ of the waveguide 1004, which can be, e.g., 1.5, 1.6, 1.7, 1.8, 1.9, 2.0, 2.1, 2.2, 2.3, 2.4, 2.5, or in a range defined by any of these values; e.g., $n_1 \geq n_2$. In some embodiments, the waveguide 1004 may correspond to the waveguides 310, 300, 290, 280, 270 (FIG. 6), for example, and/or waveguides 670, 680, and 690 (FIGS. 9A-9C), for example.

Figure 10B:
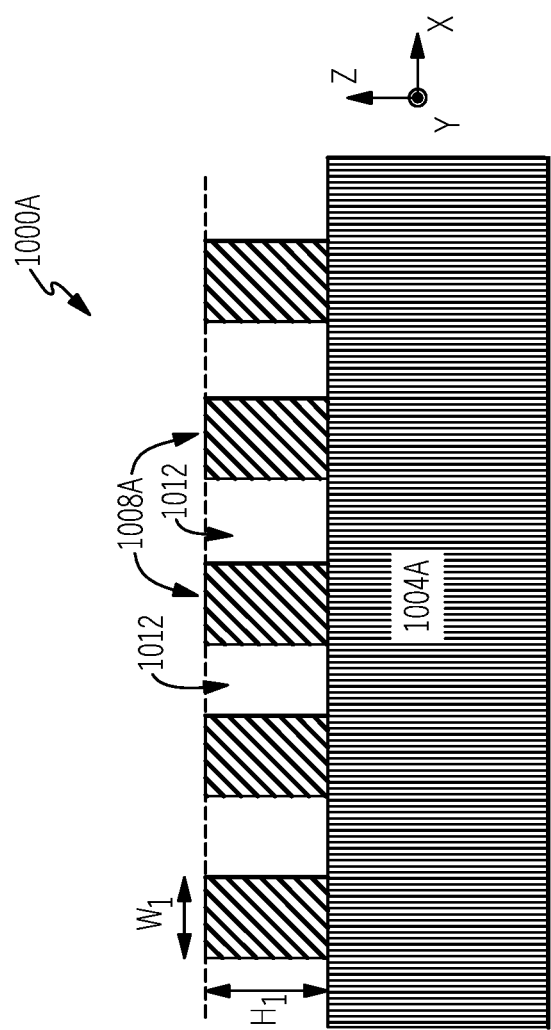
FIG. 10B schematically illustrates a cross-sectional view of a portion of a waveguide having disposed thereon a diffraction grating comprising a Li-based oxide.

FIGS. 10B and 10C schematically illustrate cross-sectional views of patterned Li-based oxide structures 1000A and 1000B respectively, which can represent portions of waveguides having disposed thereon a diffraction grating 1008 (FIG. 10A) comprising a Li-based oxide.

Referring to FIG. 10B, in some embodiments, the patterned Li-based oxide structure 1000A includes Li-based oxide features 1008A such as lines that are formed on a substrate 1004A that is formed of a material different from the Li-based oxide features 1008A. For example, the substrate 1004A can include materials based on silica glass (e.g., doped silica glass), silicon oxynitride, transition metal oxides (e.g., hafnium oxide, tantalum oxide, zirconium oxide, niobium oxide, lithium niobate, aluminum oxide (e.g., sapphire)), plastic, a polymer, or other materially optically transmissive to visible light having, e.g., a suitable refractive index as described above, that is different from the material of the Li-based oxide features 1008A.

Referring back to FIG. 10C, in some other embodiments, the patterned Li-based oxide structure 1000B includes Li-based oxide features 1008B and the substrate 1004B that both comprise a Li-based oxide. In some embodiments, the Li-based oxide structure 1000B includes Li-based oxide features 1008B that are patterned directly into the substrate 1004B, such that the Li-based oxide features 1008B and the substrate 1004B form a single piece article or a monolithically integrated structure. In these embodiments, the Li-based oxide structure 1000B may be configured such that a bulk Li-based oxide material may be patterned at the surface region to form a diffraction grating, while the Li-based oxide material below the diffraction grating may form a waveguide. In yet some other embodiments, the bulk or substrate region and the surface region patterned to form the Li-based oxide features 1008B comprise different Li-based oxides. For example, a bulk Li-based oxide material patterned at the surface region to form the Li-based oxide features 1008B may be formed of a first Li-based oxide material, while the Li-based oxide material below the Li-based oxide features 1008B that form the substrate 1004B or the substrate region may be formed of a second Li-based oxide material different from the first Li-based oxide material.

Referring to FIGS. 10B and 10C, according to various embodiments, the Li-based oxide features 1008A and 1008B have various dimensions when configured as a diffraction grating. For example, the Li-based oxide features 1008A, 1008B have a height ($H_1$) of 5 nm to 10 nm, 10 nm to 50 nm, 50 nm to 100 nm, 100 nm to 150 nm, 150 nm to 200 nm, 200 nm to 250 nm or a height in a range defined by any of these values, according to embodiments. The Li-based oxide features 1008A, 1008B periodically repeat at a pitch of 100 nm to 200 nm, 200 nm to 300 nm, 300 nm to 400 nm, 400 nm to 500 nm, of 500 nm to 600 nm, 600 nm to 700 nm, 700 nm to 800 nm, 800 nm to 900 nm, 900 nm to 1 µm, or a pitch in any range defined by any of these values, according to various embodiments. The Li-based oxide features 1008A, 1008B have a width ($W_1$) and are separated by a spacing 1012 such that they periodically repeat with a duty cycle of 0.1 to 0.2, 0.2 to 0.3, 0.3 to 0.4, 0.4 to 0.5, 0.5 to 0.6, 0.6 to 0.7, 0.7 to 0.8, 0.8 to 0.9, or a value in any range defined by any of these values, according to embodiments. The Li-based oxide features 1008A, 10008B have sidewall angles of about 70°, 75° 80°, 85°, 89°, or any value in a range defined by these values. Values outside these ranges are also possible.

According to various embodiments, when configured as an in-coupling optical element or an in-coupling diffraction grating, the Li-based oxide features 1008A, 1008B can diffractively couple light incident into the substrate 1004A, 1004B, which can be a waveguide as described above. On the other hand, when configured as an out-coupling optical element, the Li-based oxide features 1008A, 1008B can diffractively couple light from the substrate 1004, which can be a waveguide as described above, and can provide increased field of view for the user.

It will be understood that the Li-based oxide features 1008A, 1008B can be configured as one of various other structures, including fiducial markers, edge features, adhesion coating and spacers, to name a few examples.

Method of Patterning Lithium-Based Oxide

As discussed above, a diffraction grating 1008 and a waveguide 1004 having high refractive indices can enable display devices with wide field-of-view (FOV). A particularly suitable material is Li-based oxide, e.g., $LiNbO_3$. However, patterning Li-based oxide to fabricate periodic structures has been challenging because some Li-based oxides, e.g., $LiNbO_3$, are relatively inert, and traditional patterning by etching, e.g., plasma etching, has been difficult. As a result, techniques for patterning Li-based oxides have often involved complex processes that can be slow and expensive to implement. While some etch processes for Li-based oxides using fluorine-containing plasma to form volatile fluorinated niobium species have been developed, the formation and re-deposition of lithium fluoride (LiF) during etching can result in various problems, including reduced etching rate, non-vertical sidewall profiles and high sidewall roughness of the etched structures. In addition, prior patterning techniques have been limited to forming relatively large feature sizes and/or structures having low feature densities. Moreover, the problems associated with LiF redeposition becomes even more pronounced when fabricating structures having relatively small feature sizes, e.g., less than 1 µm, and/or relatively high feature density, such as patterned periodically repeating Li-based oxide structures that can be configured as a diffraction grating. This is because, as the spacing between adjacent features decreases and/or aspect ratio of the spaces increases, the negative impact of redeposition of LiF becomes more pronounced due to, among other things, decreasing line-of-site for LiF molecules to enter and escape. As a consequence, the resulting profiles of etched structures, e.g., lines, become increasingly irregular at small dimensions and/or higher feature densities. In recognition of these and other problems associated with patterning small and/or high density Li-based oxide features, the inventors have developed methods according to various embodiments that are particularly suited for forming periodically repeating patterned lithium (Li)-based oxide structures, e.g., a diffraction grating structures, with relatively small feature sizes and periodicities.

Figure 11:
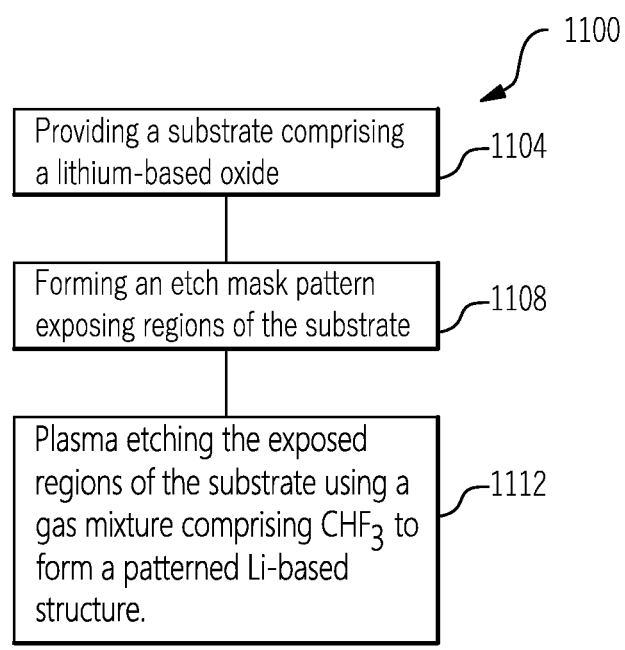
FIG. 11 schematically illustrates a method of fabricating a periodically repeating Li-based oxide structures.

FIG. 11 illustrates an overview of a method 1100 of fabricating the patterned Li-based oxide structures 1000A, 1000B. Referring to FIG. 11, the method 1100 of fabricating the patterned Li-based oxide structures 1000A, 1000B includes providing 1104 a substrate comprising a lithium-based oxide. The method additionally includes forming 1108 on the substrate an etch mask pattern that exposes regions of the substrate. When the etch mask pattern is used to form an optical element such as a diffraction grating, the etch mask pattern can periodically expose the underlying substrate. The method further includes plasma etching 1112 the exposed regions of the substrate, e.g., periodically exposed regions of the substrate, to one or more etchants. Exposing the substrate to the one or more etchants is performed in a plasma generated using a gas mixture comprising $CHF_3$ under plasma etch conditions such that the exposed regions of the substrate are etched to form a patterned Li-based oxide structure. Thus, the patterned Li-based oxide structure can comprise Li-based oxide lines that periodically repeat in a lateral direction. According to various embodiments, the patterned Li-based oxide features can include lines 1008A (FIG. 10B), 1008B (FIG. 10C) that are separated by spaces 1012 (FIGS. 10B, 10C) and periodically repeat in a lateral direction (e.g., x-direction), such that the resulting structure can be configured as a diffraction grating that can in-couple or out-couple light into or out of a waveguide by diffracting light incident thereon. In some embodiments, the Li-based oxide features can include patterns that are periodic in two directions (e.g., the x-direction and the y-direction). Further embodiments can include patterns with features with gradually increasing or decreasing spacing, heights, line widths, and shapes to tune diffraction efficiency at various locations on the waveguide.

In the following, aspects of the method 1100 (FIG. 11) of fabricating the Li-based oxide structures 1000A (FIG. 10B), 1000B (FIG. 10C) are described in detail. According to some embodiments, the Li-based oxide of the Li-based oxide features 1008A, 1008B and/or the substrate 1004A, 1004B can be a lithium niobate ($LiNbO_3$)-based oxide. As described herein, it will be understood that a $LiNbO_3$-based oxide can have a stoichiometry that deviates from the exact stoichiometric values, so long as the resulting structure can serve as a diffraction grating and/or a waveguide as disclosed herein. For example, as described herein, a $LiNbO_3$-based oxide can have a Li/(Li+Nb) ratio of 45%-55%, 47%-53%, 49-51%. 49.5%-50.5%, or a ratio in any range defined by any of these values. Values outside these ranges are also possible. For example, because $LiNbO_3$ having a stoichiometric composition melts incongruently whereas $LiNbO_3$ melts congruently for a non-stoichiometric composition of Li/(Li+Nb) of about 48.6%, as grown single crystal of lithium niobate grown using melt growth methods such as Czochralski (Cz) technique may have a lithium-deficient non-stoichiometric composition within the Li/(Li+Nb) ratio described above.

In addition, as described herein, the $LiNbO_3$-based oxide can have intentional or unintentional defects associated with Li, Nb or O, which can be vacancies or impurities such as dopants. For example, the $LiNbO_3$-based oxide can be doped by MgO, which can increase its resistance to optical damage. Other impurities that the $LiNbO_3$-based oxide can be doped with include Fe, Zn, Hf, Cu, Gd, Er, Y, Mn and B, to name a few.

According to some other embodiments, the Li-based oxide of the Li-based oxide features 1008A, 1008B and/or the substrate 1004A, 1004B can be a lithium tantalate ($LiTaO_3$)-based oxide. As described herein, it will be understood that a LiTaO$_3$-based oxide can have a stoichiometry that deviates from the exact stoichiometric values, so long as the resulting structure can serve as a diffraction grating and/or a waveguide as disclosed herein. For example, as described herein, a LiTaO$_3$-based oxide can have a Li/(Li+ Ta) ratio of 45%-55%, 47%-53%, 49-51%. 49.5%-50.5%, or a ratio in a range defined by any of these values. Values outside these ranges are also possible. In addition, the LiTaO$_3$-based oxide according to embodiments can be doped with similar elements as described above with respect to LiNbO$_3$.

FIGS. 12A-12C and 13A-13C illustrate forming an etch mask pattern 1220 for etching to form the Li-based oxide structures described above. The etch mask pattern 1220, which can include lines 1220a, 1220b and exposed substrate regions therebetween, can be formed using a suitable process including a lithographic process (FIGS. 12A-12C) and a nano-imprinting process (FIGS. 13A-13C), as described below. In some embodiments, as described with respect to FIGS. 12A-12C, forming the etch mask pattern 1220 may be performed by depositing a suitable blanket etch mask layer material, followed by patterning the etch mask layer using lithography and etch processes. In some other embodiments, as described with respect to FIGS. 13A-13C, forming the etch mask pattern 1220 may be performed by depositing a suitable blanket imprint mask layer, followed by patterning the imprint mask layer using a nanoimprint technique.

Figure 12A:
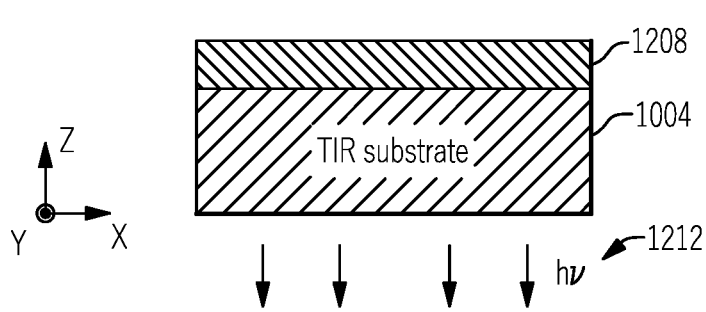
FIGS. 12A-12C are cross-sectional views of intermediate structures at various stages of forming an etch mask pattern, using a photolithographic process, for fabricating periodically repeating Li-based oxide structures.
Figure 12B:
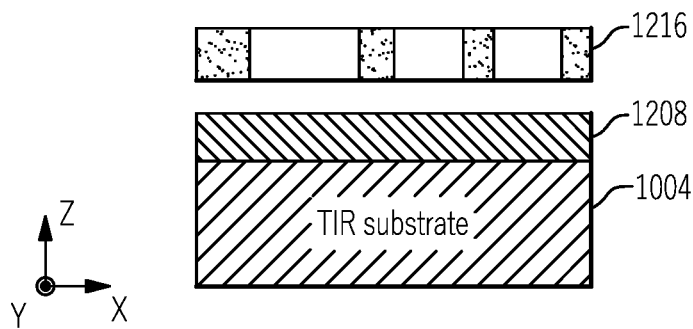
Figure 12C:
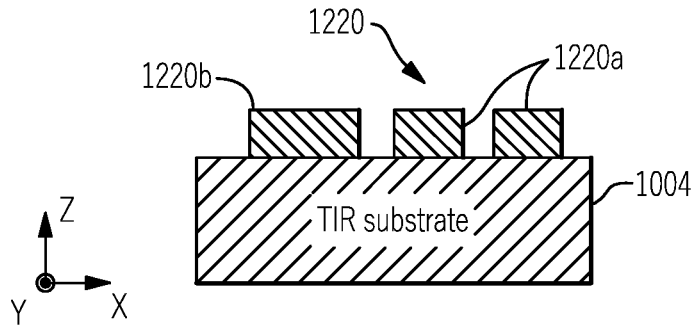

FIGS. 12A-12C illustrate cross-sectional views of intermediate structures 1200A-1200C, respectively, at various stages of forming the etch mask pattern 1220 using a lithographic process, according to embodiments. Referring to the intermediate structure 1200A of FIG. 12A, the method includes providing a substrate 1004 as described above. The method additionally includes forming on the substrate 1004 a blanket etch mask layer 1208. The blanket etch mask layer 1208 is adapted, when patterned, to serve as an etch mask that can be used to pattern Li-based oxide structures, as described above with reference to FIGS. 10B and 10C.

In some embodiments, the blanket etch mask layer 1208 may be formed of a suitable material to serve as an etch mask for forming the Li-based oxide features 1008A, 1008B (FIGS. 10B, 10C). While many factors can determine the suitability of the material of the etch mask layer 1208, one such factor is the etch selectivity of the material of the blanket etch mask layer 1208 relative to the substrate 1004. The etch selectivity of the blanket etch mask layer 1208 to the substrate 1004 may be such that, for a suitable thickness of the blanket etch mask layer 1208, at least some of the etch mask layer 1208 remains above the substrate 1004 in masked regions after patterning. When the etch selectivity is suitably high and/or the depth of etch is relatively small, the blanket etch mask layer 1208 may be formed of a polymer-based photoresist. When the blanket etch mask layer 1208 is formed of a photoresist layer, it may be deposited by spin-coating, followed by a post-bake. However, embodiments are not so limited. Under some circumstances, a blanket etch mask layer 1208 that is formed of photoresist alone may not provide sufficient selectivity to the substrate 1004. For example, when the depth of features to be patterned are relatively thick, the etch mask layer 1208 may be substantially removed by the time the desired depths of the etched features are achieved. In these circumstances, a combination of a photoresist and a hard mask layer may be used as the blanket etch mask layer 1208. Thus, in some embodiments, instead of a single layer of photoresist that is directly used as an etch mask pattern 1220, the blanket etch mask layer 1208 may be formed as a stack of layers including a hard mask layer formed on the substrate 1004 and a photoresist layer formed on the hard mask layer. A suitable hard mask layer may have a lower etch rate compared to the photoresist, thereby providing higher etch selectivity of the substrate 1004 relative to the hard mask. In some embodiments, a suitable hard mask layer comprises an inorganic dielectric material such as SiO$_x$, TiO$_x$, SiN$_x$, and AlO$_x$, to name a few examples. In some other embodiments, a suitable hard mask layer comprises an organic/inorganic composite dielectric material such as, e.g., silsesquioxane having a formula [RSiO$_{3/2}$]$_n$, where R comprises an organic or inorganic group such as hydrogen, alkyl, halide or alkoxide, to name a few. In yet some other embodiments, a suitable hard mask layer comprises a metal or an alloy including chromium, nickel and copper, to name a few.

Referring to the intermediate structure 1200B of FIG. 12B, after deposition and post-deposition bake of the blanket etch mask layer 1208, which can include a single layer or a stack of layers as described above, the method proceeds to selectively expose portions of the blanket etch mask layer 1208 to a pattern of light produced by a photomask 1216. As illustrated, the photomask 1216 can be a positive photomask adapted for a positive photoresist, and can be configured to pass light in regions where the base polymer layer 1208 is to remain. When the photomask 1216 is a negative photomask adapted for a negative photoresist, the photomask could be oppositely configured to pass light in regions where the base polymer layer 1208 is to be removed from.

The exposure to light 1212, e.g., coherent UV light, or an electron beam, causes a chemical change, e.g., polymeric crosslinking in the blanket etch mask layer 1208, e.g., the photoresist of the blanket etch mask layer 1208. The chemical change in turn allows exposed portions of the blanket etch mask layer 1208 to be selectively removed using a developer solution for the blanket etch mask layer 1208 including or serving as a positive photoresist, or allows unexposed portions of the unexposed portions of blanket etch mask layer 1208 to be selectively removed using a developer solution for the blanket etch mask layer 1208 including or serving as a negative photoresist.

Referring to the intermediate structure 1200C of FIG. 12C, upon selectively removing portions of the blanket etch mask layer 1208, the resulting etch mask pattern 1220 remains on the substrate 1004, thereby serving as a template for subsequent patterning of the surface region of the substrate 1004. The etch mask pattern 1220 may include a set of etch mask lines 1220a, which may be periodically repeating in a first lateral direction e.g., x-direction, that is elongated in a second lateral direction, e.g., the y-direction. Alternatively or additionally, the etch mask pattern 1220 may include a set of etch mask lines 1220b, which may be periodically repeating in a second lateral direction, e.g., y-direction, that is elongated in a second direction, e.g., the x-direction. Etch mask lines elongated in other directions are possible.

Figure 13A:
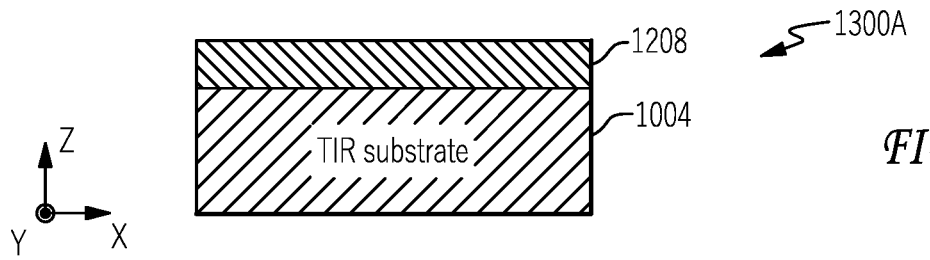
FIGS. 13A-13C are cross-sectional views of intermediate structures at various stages of forming an etch mask pattern, using a nanoimprinting process, for fabricating periodically repeating Li-based oxide structures.
Figure 13B:
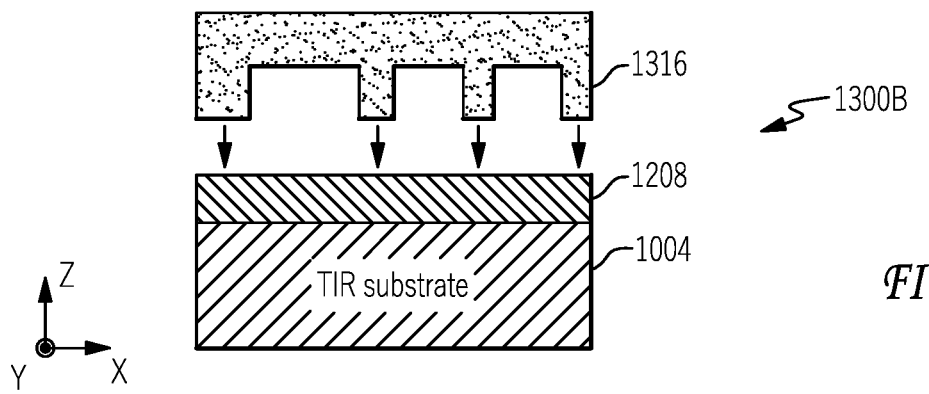
Figure 13C:
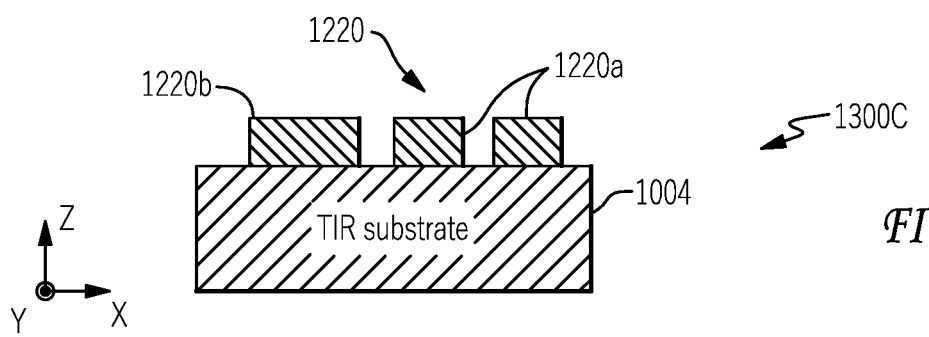

FIGS. 13A-13C illustrate cross-sectional views of intermediate structures 1300A-1300C, respectively, at various stages of forming the etch mask pattern 1220 using a nanoimprint process. In the illustrated example, the method of forming the intermediate structure 1300A is similar to the method of forming the intermediate structure 1200A of FIG. 12A. However, the method of forming the intermediate structures 1300B and 1300C of FIGS. 13B and 13C, respectively, is different from the method forming the intermediate structure 1200B and 1200C of FIGS. 12B and 12C, respectively, whose differences are described below.

Referring to the intermediate structure 1300B of FIG. 13B, unlike the method described above with reference to FIG. 12B, instead of patterning the blanket etch mask layer 1208 by selectively exposing and removing portions thereof using light or an electron beam and a developer solution, in the illustrated example, a nanoimprint template 1316, or a nanoimprint mold, which has predefined topological patterns in accordance with formation of the etch mask pattern 1220, is brought into contact with the blanket etch mask layer 1208. Subsequently, the template 1316 is pressed into the blanket etch mask layer 1208, which can include a thermoplastic polymer under certain temperature, e.g., above the glass transition temperature of the blanket etch mask layer 1208, thereby transferring the pattern of the template 1316 into the softened blanket etch mask layer 1208, thereby forming the etch mask pattern 1220. After being cooled down, the template 1316 is separated from the etch mask pattern 1220, and the etch mask features such as lines 1220a, 1220b are left on the substrate 1004. In some other approaches, after being pressed into the base polymer layer 1208, the etch mask pattern 1208 is hardened by crosslinking under UV light.

After forming the etch mask pattern 1220, the intermediate structures 1200C (FIG. 12C), 1300C (FIG. 13C) are placed in a plasma reactor 1400 configured for gas-phase plasma processing, according to embodiments. The plasma reactor 1400 comprises at least one electrode that can be energized to impart energy to gas phase atoms or molecules above the surface of the intermediate structures 1200C, 1300C to generate a plasma.

The illustrated plasma reactor 1400 can be an inductively-coupled plasma (ICP) reactive ion etch (RIE) reactor, which is configured to generate a high-density plasma by inductively coupling a plasma-generating ICP power from an RF antenna 1404 or coil to the volume of gas inside the reactor 1400. The RF antenna 1404, located adjacent to the plasma generation region, creates an alternating RF magnetic field and induces RF electric fields, which energize electrons that participate in the ionization of gas molecules and atoms at low pressure. A separate ion-biasing RF power source 1408 can be connected to the cathode or the substrate to generate a DC bias and attract ions to the substrate. As configured, it is possible to decouple ion current and ion energy applied to the substrate. Thus, surface regions of the intermediate structures 1200C, 1300C are etched with the use of a chemically reactive plasma under low-pressure conditions, potentially combined with ion-induced etching.

The reactor 1400 is configured to receive, through one or more of gas inlets 1412 connected to the reactor 1400, at least one gas species for generating a gas phase plasma. The reactor can also be connected to a vacuum pump to control the pressure inside the reactor. In particular, the reactor is configured to control the pressure inside the reactor and to maintain suitable partial pressures of all gas species. For example, the reactor may be configured to generate and maintain the plasma under subatmospheric and atmospheric conditions, e.g., by controlling and maintaining a suitable pressure. After receiving the at least one gas species through the at least one of the gas inlets 1412, the ICP power is applied by the RF antenna to the volume of gas above the surface of the substrate, thereby generating a plasma 1416.

While the illustrated reactor 1400 is configured as an ICP RIE reactor, embodiments are not so limited, and other types of plasma generation can be employed. In some embodiments, the plasma reactor 1400 can be a capacitively coupled plasma (CCP) reactor, which can be a DC or an AC plasma reactor in which a DC power or an AC power is applied, respectively, between the two electrodes to form a capacitively coupled plasma discharge. In embodiments in which the plasma reactor is a DC plasma reactor, the plasma reactor may be configured as a pulsed DC plasma reactor in which the DC power can be applied in a pulsed form. A pulsed DC voltage can be bipolar or unipolar. When bipolar, the DC voltage can be symmetric or asymmetric in amplitudes in opposite polarities. The DC or AC power can be applied through one or both of the two electrodes, which can be driven by the same or different power supplies. In some embodiments, each of the electrodes are connected to a power supply, while in some other embodiments, only one of the two electrodes can be "hot" while the other is electrically grounded or floated. In some other embodiments, when one of the two electrodes are "hot" and receives pulsed DC or AC power, the other electrode can be placed under a bias, e.g., a DC bias such that charged species can accelerate towards the substrate. In yet other embodiments, the electrodes can be driven with dual frequencies, where one of the electrodes is driven at a higher RF frequency to supply power to the electrons to control the plasma density, while the other of the electrodes is driven at a lower RF frequency to control ion bombardment to the substrate.

Yet, other types of plasma reactors are possible, such as an electron cyclotron resonance (ECR) plasma reactor in which the energy is supplied by electrical currents produced by time-varying magnetic fields, which can enhance the densities of the plasmas under some circumstances.

Thus, the exposed substrate regions of the intermediate structures 1200C, 1300C are etched in any one of the above-described plasma reactor configurations, or using other configurations. The details of etching parameters are described below with respect to FIG. 15, which illustrates an intermediate structure 1500 during etching. In the following, various etching conditions according to embodiments are described.

In some embodiments, prior to striking or generating the plasma 1416, the composition of the gas in the plasma reactor 1400 is adjusted by introducing one or more gases into the plasma reactor 1400 through one or more gas inlets 1412. In various embodiments, a mixture of gases in the generated plasma 1416 includes a fluorocarbon gas comprising $CHF_3$ and molecular hydrogen ($H_2$). In some embodiments, the volume of gas can additionally include an inert gas such as He, Ar, Ne and Xe, or mixtures thereof. In some embodiments, the mixture of gases consists essentially of $H_2$, $CHF_3$ and Ar. In various embodiments, a ratio of $CHF_3$ to $H_2$ in the gas mixture is in a range defined by any two of 10:1, 10:3, 10:5, 10:7, 10:10, 7:10, 5:10, 3:10 and 1:10, inclusive of these ratios. In various embodiments, the inert gas in the mixture of gases in a range defined by any two of 10%, 30%, 50%, 70% and 90%, inclusive of these percentages. Values outside these ranges are possible. Without being bound to any theory, the mixture of gases can be effective in reducing the generation or redeposition or both of nonvolatile LiF on the exposed surfaces, including bottom and sidewall surfaces of trenches, such that the resulting patterned Li-based oxide features including lines 1008 separated by spaces 1012 are suitable as a diffraction grating that can in-couple or out-couple by diffracting light incident thereon.

In some embodiments, during etching, the reactor 1400 can be maintained at a constant pressure. Without being bound to any theory, a relatively lower pressure can provide, by increasing the mean free path, relatively higher directionality of the ions, which can lead to steeper sidewall profiles. On the other hand, a relatively higher pressure can increase the partial pressures and concentrations of the reactants, which can lead to increased etch rate. The inventors have determined that a suitable balance can be achieved between the mean free path of the ions and the availability of reactants to obtain the desired etch rate and profiles. Depending on the specific process, according to various embodiments, the reactor 1400 can be maintained at a constant pressure in a range defined by any two of 1 mTorr, 10 mTorr, 20 mTorr, 30 mTorr, 40 mTorr, 50 mTorr, 60 mTorr, 70 mTorr, 80 mTorr, 90 mTorr and 100 mTorr, inclusive of these pressures. Values outside these ranges are possible.

Figure 14:
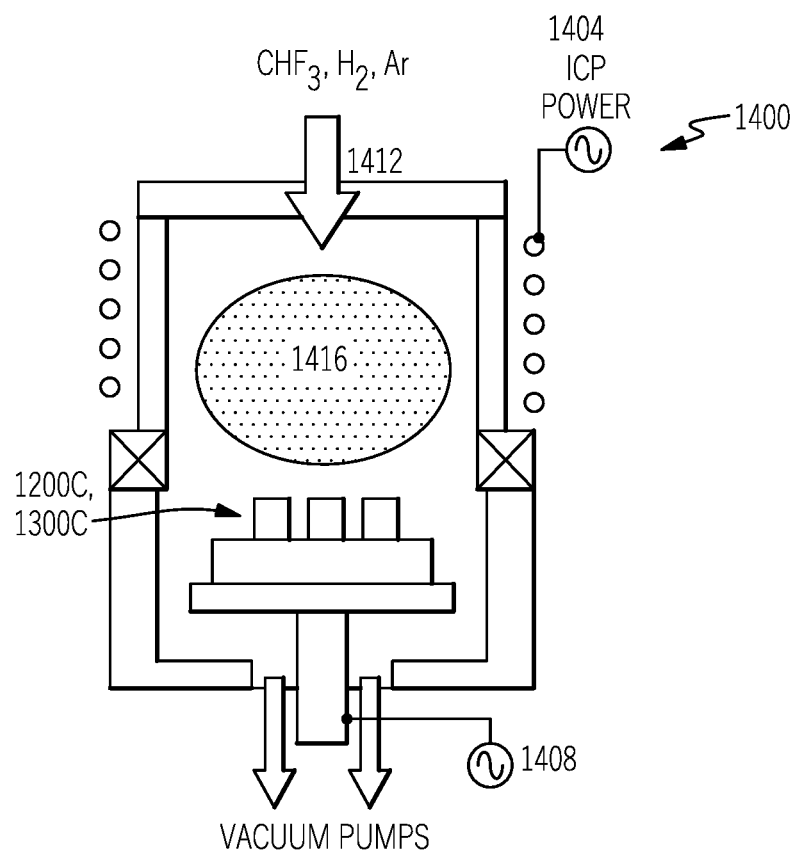
FIG. 14 schematically illustrates a plasma reactor configured for fabricating periodically repeating Li-based oxide structures.

A sufficient RF power is applied in the reactor 1400 to provide, among other things, a suitable plasma density. According to various embodiments, a plasma-generating ICP RF power delivered to the volume of gas above the substrate by, e.g., the ICP RF antenna 1404 or coil 1404 illustrated in FIG. 14, is in a range defined by any two of 50 W, 100 W, 200 W, 300 W, 400 W, 500 W, 600 W, 700 W, 800 W, 900 W and 1000 W, inclusive of these powers. Values outside these ranges are possible. As discussed above, the plasma-generating ICP RF power can control, among other things, the plasma density. According to various embodiments, in addition to the plasma-generating ICP RF power, an ion-biasing RF power may be delivered to the cathode by, e.g., the cathode RF power source 1408 (FIG. 14), in a range defined by any two of 50 W, 100 W, 200 W, 300 W, 400 W, 500 W, 600 W, 700 W, 800 W, 900 W and 1000 W, inclusive of these powers. Values outside these ranges are possible. As discussed above, the ion-biasing RF power can control, among other things, the energy of ions bombarding the substrate. The frequency of the ICP RF power and the cathode RF power can be, for example, a regulated RF frequency of 13.56 MHz, or a regulated microwave frequency of 2.45 GHz, or other frequencies. The plasma-generating RF power and the ion-biasing RF power can, individually or in combination, change the etch rate. It will be appreciated that, under some circumstances, higher etch rate may lead to lower etch selectivity against etch mask layers.

The inventors have found that, by controlling various reactor parameters such as pressure, RF power and gas flows/ratios, various etch parameters for controlling the LiF generation and/or redeposition rates, as well as the resulting etch profiles, can be controlled. For example, as discussed above, various process parameters can affect the etch rate. By controlling one or more of these parameters, the etch rate is controlled at a rate in a range defined by any two of 1 nm/min., 5 nm/min., 10 nm/min., 15 nm/min., 20 nm/min., 25 nm/min. and 30 nm/min., inclusive of these rates, according to embodiments. Values outside these ranges are possible. In addition, the etch selectivity defined by the removal rate of Li-based oxide:the removal rate of the etch mask layer can be controlled at a ratio in a range defined by any two of 10:1, 5:1, 2:1, 1:1, 1:2, 1:5 and 1:10, inclusive of these ratios, according to embodiments. Values outside these ranges are possible.

Figure 15:
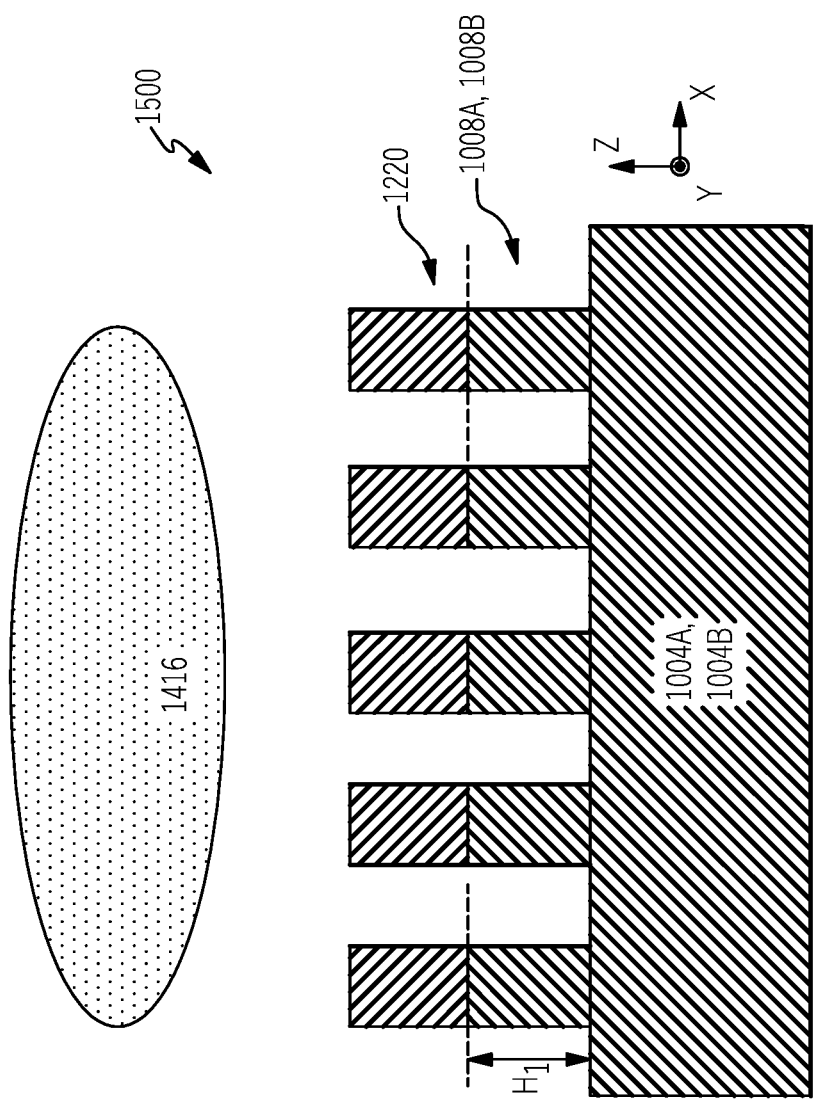
FIG. 15 is a cross-sectional view of an intermediate structure after etching a Li-based oxide substrate to form Li-based oxide features using an etch mask formed according to methods illustrated in FIGS. 12A-12C or FIGS. 13A-13C.
Figure 16B:
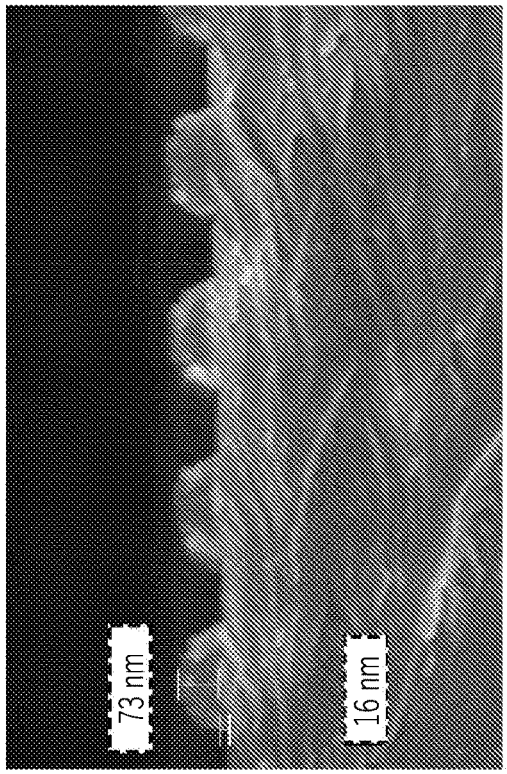
FIGS. 16A-16D are cross-sectional scanning electron micrographs of intermediate structures after forming an etch mask pattern and etching a Li-based oxide substrate using a plasma comprising $CHF_3$.
Figure 16D:
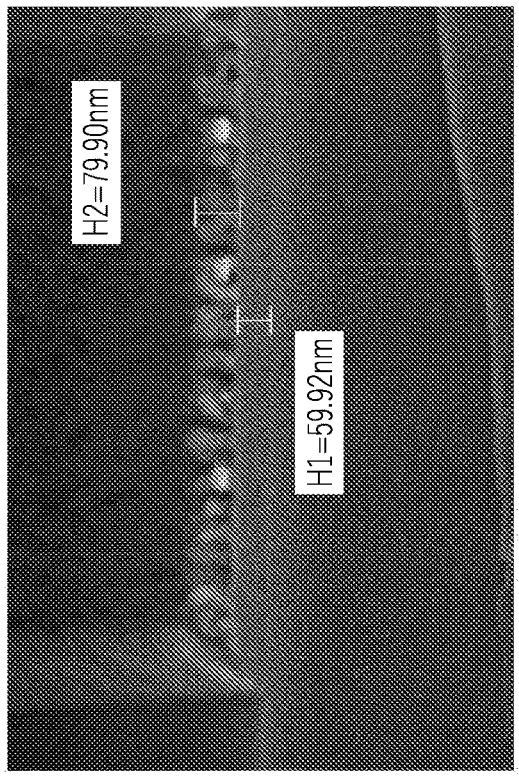
Figure 16A:
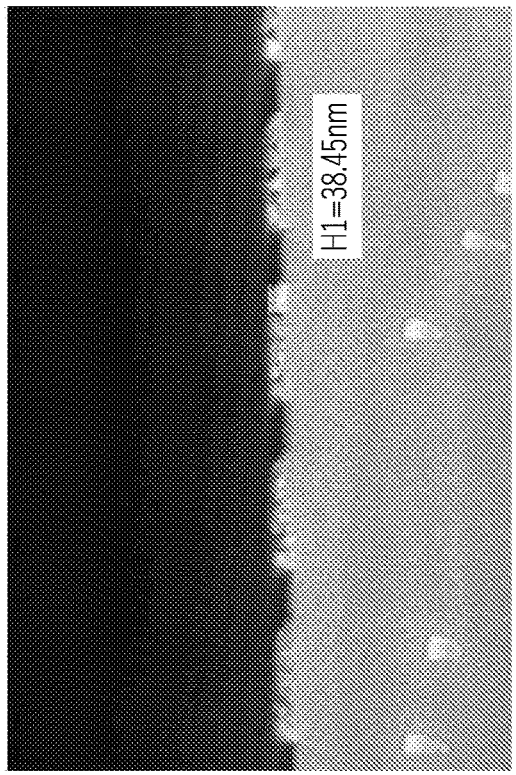
Figure 16C:
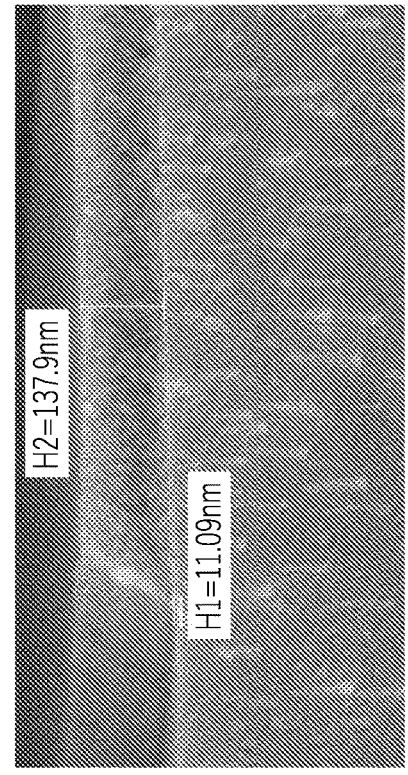

The resulting intermediate structure 1500 is illustrated in FIG. 15. The intermediate structure 1500 includes the Li-based oxide features 1008A, 1008B that are patterned using the etch mask features 1220. Thus fabricated Li-based oxide features 1008a, 1008B have various dimensions as described above with respect to FIGS. 10B and 10C. Subsequently, the etch mask features 1220 may be removed using a suitable dry and/or wet process. For example, when the etch mask features 1220 are formed of photoresist, the etch mask features 1220 may be removed by a resist stripping or ashing process in which an oxidizing reactive species such as reactive oxygen or fluorine species, e.g., oxygen or fluorine free radicals, are used to form volatile gases and pumped away. In some embodiments, the ashing or stripping process is performed at a relatively high temperature to remove a bulk of the photoresist, followed by a descum process used to remove residual photoresist in the trenches.

In some embodiments, the etch mask features 1220 are removed in-situ by plasma generated in the reactor 1400 (FIG. 14). In some other embodiments, the etch mask features 1220 are removed in a separate tool, e.g., in which the oxidizing species, such as reactive oxygen or fluorine species, can be formed using remote or downstream plasma generator.

In embodiments where the etch mask features 1220 include a hardmask under a photoresist, after the photoresist is removed, the remaining hard mask layer may be removed using a suitable dry or wet removal process, depending on the material of the hardmask.

After removing the etch mask features 1220, the intermediate structure 1500 may be cleaned in a suitable wet cleaning solution. For example, the intermediate structure 1500 may be wet cleaned by immersing in a base piranha solution comprising a mixture of ammonium hydroxide, hydrogen peroxide and water at a ratio of 2:2:1 at room temperature for 15 min. to 240 min. or more.

Example Process Conditions

An experimental etch matrix summarized below in TABLE 1 below was performed to illustrate the effect of various process parameters.

TABLE 1

| Sample | $CFH_3/CF_4/H_2/Ar$ (sccm) | Pressure (mTorr) | ICP RF (W) | Cathode/Substrate RF (W) | Time (sec.) | Etch Rate (nm/min.) | Selectivity |
|---|---|---|---|---|---|---|---|
| Example 1 | 10/0/6/80 | 15 | 200 | 120 | 120 | 15 | 0.6 |
| Example 2 | 10/0/6/80 | 10 | 200 | 100 | 180 | 20 | 0.3 |
| Example 3 | 10/0/8/80 | 10 | 400 | 100 | 180 | | |
| Example 4 | 10/0/0/12 | 10 | 200 | 100 | 120 | 0 | |
| Example 5 | 10/25/0/50 | 10 | 200 | 100 | 120 | 5 | 0.1 |
| Example 6 | 10/25/0/30 | 20 | 200 | 100 | 120 | 8 | 0.1 |
| Example 7 | 10/25/0/30 | 10 | 400 | 100 | 120 | | |

Figure 18:
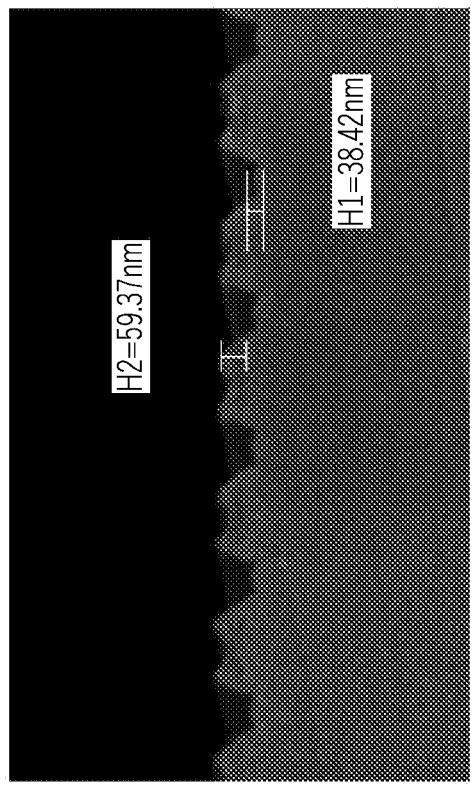
FIG. 18 is a cross-sectional scanning electron micrograph of an intermediate structure after forming an etch mask pattern and etching a Li-based oxide substrate using a plasma comprising $H_2$ and $CHF_3$.
Figure 17:
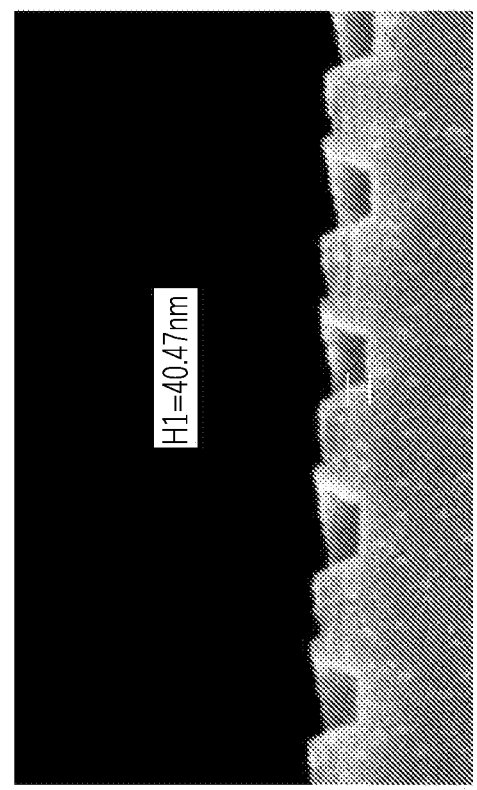
FIG. 17 is a cross-sectional scanning electron micrograph of an intermediate structure after forming an etch mask pattern and etching a Li-based oxide substrate using a plasma comprising $H_2$ and $CHF_3$.

FIGS. 16A-16D are cross-sectional scanning electron micrographs illustrating the etch profiles obtained by etching LiNbO$_3$ substrates using process recipes according to Examples 4-7 in TABLE 1, respectively, in which CFH$_3$ and Ar were flowed but no H$_2$ was flowed into the chamber during the etch process. In contrast, FIGS. 17, 18 and 19A illustrate cross-sectional etch profiles obtained by etching LiNbO$_3$ substrates using process recipes according to Examples 1-3 in TABLE 1, respectively, in which CFH$_3$, Ar and H$_2$ were flowed into the chamber during the etch process. As illustrated by the cross-sectional etch profiles, the co-presence of CFH$_3$ and H$_2$ results in enhanced etch rate and selectivity.

Figure 19B:
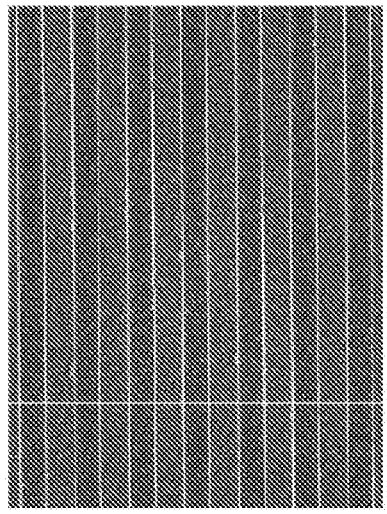
FIG. 19B is a plan-view scanning electron micrograph of the intermediate structure shown in FIG. 19A, as dry-etched.
Figure 19C:
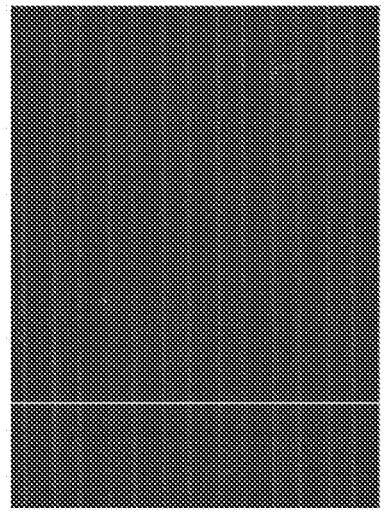
FIG. 19C is a plan-view scanning electron micrograph of the intermediate structure shown in FIG. 19B, after wet cleaning.
Figure 19A:
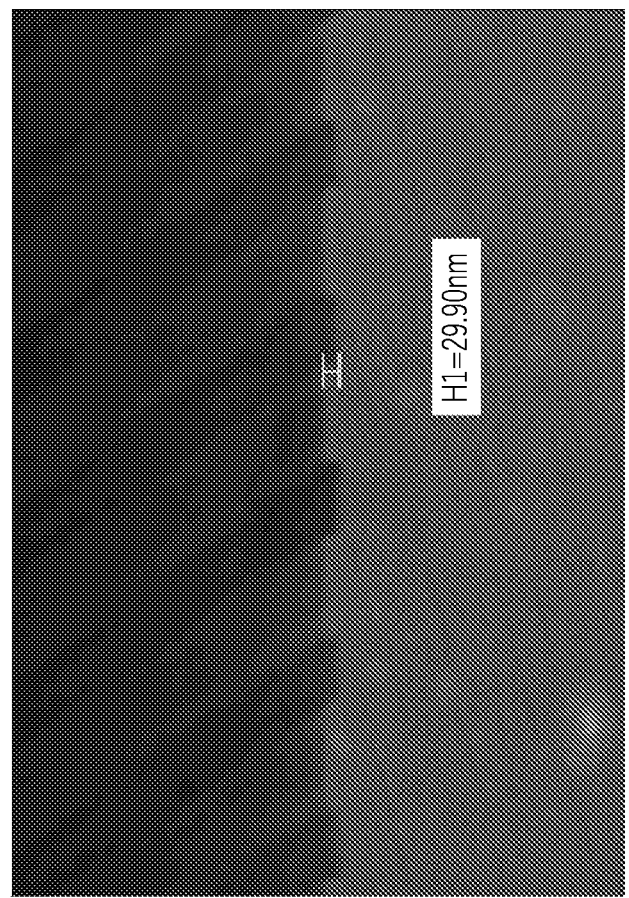
FIG. 19A is a cross-sectional scanning electron micrograph of an intermediate structure after forming an etch mask pattern and etching a Li-based oxide substrate using a plasma comprising $H_2$ and $CHF_3$.

FIGS. 19B and 19C illustrate top-down scanning electron micrographs illustrating the effect of wet cleaning the as-etched sample in a base piranha solution. FIG. 19B illustrates a plan view scanning electron micrograph of the sample shown in FIG. 19A before cleaning, and 19C illustrates a plan view scanning electron micrograph of the sample shown in FIG. 19B after cleaning. The removal of white residues visible in FIG. 19B indicates the effectiveness of the wet clean process using a base piranha solution.

ADDITIONAL EXAMPLES

1. A method of fabricating a display device, the method comprising:
   providing a substrate comprising a lithium (Li)-based oxide;
   forming an etch mask pattern exposing regions of the substrate; and
   plasma etching the exposed regions of the substrate using a gas mixture comprising $CHF_3$ to form a diffractive optical element,
   wherein the diffractive optical element comprises Li-based oxide features configured to diffract visible light incident thereon.

2. The method of Example 1, wherein the diffractive optical element comprises a diffraction grating.

3. The method of Examples 1 or 2, wherein the etch mask pattern periodically exposes the substrate such that the Li-based oxide features periodically repeat in a lateral direction.

4. The method of any one of the above Examples, wherein the gas mixture further comprises $H_2$ and an inert gas.

5. The method of any one of the above Examples, wherein a ratio of $CHF_3$ to $H_2$ in the gas mixture is in a range of 10:1 to 1:10.

6. The method of any one of the above Examples, wherein the inert gas in the gas mixture is in a range of 10% to 90% on the basis of a total volume of the gas mixture.

7. The method of any one of the above Examples, wherein the gas mixture consists essentially of $H_2$, $CHF_3$ and Ar.

8. The method of any one of the above Examples, wherein plasma etching comprises etching at a rate in a range of 1 nm/min. to 30 nm/min.

9. The method of any one of the above Examples, wherein plasma etching comprises etching using a plasma generated by dual RF frequencies.

10. The method of any one of the above Examples, wherein plasma etching comprises etching using a plasma generated by an RF power in a range of 50 W to 500 W.

11. The method of any one of the above Examples, wherein plasma etching comprises etching in a reaction chamber at a pressure in a range of 10 mTorr to 50 mTorr.

12. The method of any one of the above Examples, wherein plasma etching comprises etching the substrate selectively against the etch mask pattern at an etch rate selectivity ratio in a range of 1:0.1 to 1:5.

13. The method of any one of the above Examples, wherein forming the etch mask pattern comprises forming using a lithography technique.

14. The method of any one of the above Examples, wherein forming the etch mask pattern comprises forming using a nanoimprinting technique.

15. The method of any one of the above Examples, wherein the etch mask pattern is formed of a photoresist, a dielectric material, a metal or a composite material.

16. The method of any one of the above Examples, wherein the etch mask pattern is formed of a metal or a metal alloy.

17. The method of any one of the above Examples, further comprising wet cleaning the substrate subsequent to plasma etching in a solution comprising ammonium hydroxide, hydrogen peroxide and water.

18. The method of any one of the above Examples, wherein the Li-based oxide features have a refractive index greater than 2.0.

19. The method of any one of the above Examples, wherein the Li-based oxide features comprise a lithium niobate or a lithium tantalate.

20. The method of any one of the above Examples, wherein the Li-based oxide features have a height in a range of 10 nm to 200 nm.

21. The method any one of the above Examples, wherein the Li-based oxide features periodically repeat at a pitch in a range of 200 nm to 1 μm.

22. The method of any one of the above Examples, wherein the Li-based oxide features have a duty cycle in a range of 0.1 to 0.9.

23. The method of any one of the above Examples, wherein forming the diffractive optical element comprises forming on a waveguide configured to guide visible light in a lateral direction.

24. The method of any one of the above Examples, wherein forming the diffractive optical element comprises forming on a waveguide comprising the Li-based oxide.

25. The method of any one of the above Examples, wherein the diffractive optical element is formed on the substrate comprising a waveguide, and wherein the waveguide is integrated with the diffractive optical element as a monolithically integrated structure.

26. The method of any one of the above Examples, wherein the diffractive optical element is formed on a waveguide, and wherein the waveguide comprises a material different from the Li-based oxide.

27. The method of any one of the above Examples, wherein the diffractive optical element serves as an incoupling element formed on the substrate that serves as a waveguide to couple light into the waveguide.

28. The method of any one of the above Examples, wherein the diffractive optical element serves as an outcoupling element formed on the substrate that serves as a waveguide to couple light out of the waveguide.

29. The method of any one of the above Examples, wherein the diffractive optical element is formed on the substrate comprising a waveguide configured to guide visible light having any wavelength in the visible spectrum that is incoupled or outcoupled by the diffractive optical element.

30. The method of any one of the above Examples, wherein the diffractive optical element is formed on the substrate comprising a waveguide configured to guide visible light that is incoupled by or outcoupled through the diffractive optical element via total internal reflection.

31. A method of fabricating a display device, the method comprising:
   providing a substrate comprising a lithium (Li)-based oxide;
   forming an etch mask pattern comprising exposed regions of the substrate; and
   plasma etching the exposed regions of the substrate using a gas mixture comprising $CHF_3$ and $H_2$ to form a patterned Li-based oxide structure.

32. The method of Embodiment 31, wherein a ratio of $CHF_3$ to $H_2$ in the gas mixture is in a range of 10:1 to 1:10.

33. The method of Examples 31 or 32, further comprising an inert gas in the gas mixture in a range of 10% to 90% of a total volume of the gas mixture.

34. The method of any one of Examples 31-33, wherein plasma etching comprises etching at a rate of 1 nm/min. to 30 nm/min.

35. The method of any one of Examples 31-34, wherein plasma etching comprises etching in an inductively coupled plasma reactor.

36. The method of any one of Examples 31-35, wherein plasma etching comprises applying a plasma generated by an inductive RF power in a range of 50 W to 500 W.

37. The method of any one of Examples 31-36, wherein plasma etching further comprises applying an RF power in a range of 50 W to 500 W to the substrate.

38. The method of any one of Examples 31-37, wherein plasma etching comprises etching in a reaction chamber at a pressure in a range of 10 mTorr to 50 mTorr.

39. The method of any one of Examples 31-38, wherein plasma etching comprises etching the substrate selectively against the etch mask pattern at an etch rate selectivity ratio in a range of 1:0.1 to 0.1:1.

40. The method of any one of Examples 31-39, wherein the etch mask pattern periodically exposes regions of the substrate, such that plasma etching forms a diffraction grating comprising Li-based oxide features that periodically repeat in a lateral direction.

41. The method of Example 40, wherein the diffraction grating is formed on the substrate comprising a waveguide, and wherein the waveguide is integrated with the diffraction grating as a monolithic structure.

42. The method of any one of Examples 40-42, wherein the diffraction grating is formed on a waveguide, and wherein the waveguide comprises a material different from the Li-based oxide.

43. The method of any one of Examples 40-42, wherein the diffraction grating comprises an incoupling element or an outcoupling element formed on the substrate that comprises a waveguide.

44. The method of any one of Examples 40-43, wherein the diffraction grating is formed on the substrate comprising a waveguide configured to guide visible light having a wavelength in the visible spectrum that is incoupled or outcoupled by the diffraction grating.

45. The method of any one of Examples 40-44, wherein the diffraction grating is formed on the substrate comprising a waveguide configured to guide visible light that is incoupled by or outcoupled through the diffraction grating via total internal reflection.

46. The method of any one of Examples 31-39, wherein the patterned Li-based oxide structure comprises one or more of fiducial markers, edge features, adhesion coating and spacers.

ADDITIONAL CONSIDERATIONS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, it will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one or more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Accordingly, the claims are not intended to be limited to the embodiments shown herein, but are to be accorded the widest scope consistent with this disclosure, the principles and the novel features disclosed herein.

What is claimed is:

1. A method of fabricating a display device, the method comprising:

providing a substrate comprising a lithium (Li)-based oxide;
forming an etch mask pattern exposing regions of the substrate; and
plasma etching the exposed regions of the substrate using a gas mixture consisting essentially of $H_2$, $CHF_3$ and Ar to form a diffractive optical element,
wherein the diffractive optical element comprises Li-based oxide features configured to diffract visible light incident thereon.

2. The method of claim 1, wherein the diffractive optical element comprises a diffraction grating.

3. The method of claim 1, wherein the etch mask pattern periodically exposes the substrate such that the Li-based oxide features periodically repeat in a lateral direction.

4. The method of claim 1, wherein a ratio of volumes of $CHF_3$ to $H_2$ in the gas mixture is in a range of 10:1 to 1:10.

5. The method of claim 1, wherein the Ar in the gas mixture is in a range of 10% to 90% on the basis of a total volume of the gas mixture.

6. The method of claim 1, wherein plasma etching comprises etching at a rate of 1 nm/min. to 30 nm/min.

7. The method of claim 1, wherein plasma etching comprises etching using a plasma generated by dual RF frequencies.

8. The method of claim 1, wherein plasma etching comprises etching using a plasma generated by an RF power in a range of 50 W to 500 W.

9. The method of claim 1, wherein plasma etching comprises etching in a reaction chamber at a pressure of 10 mTorr to 50 mTorr.

10. The method of claim 1, wherein plasma etching comprises etching the substrate selectively against the etch mask pattern at an etch rate selectivity ratio of 1:0.1 to 1:5.

11. The method of claim 1, wherein forming the etch mask pattern comprises forming using a lithography technique.

12. The method of claim 1, wherein forming the etch mask pattern comprises forming using a nanoimprinting technique.

13. The method of claim 1, wherein the etch mask pattern is formed of a photoresist, a dielectric material, a metal or a composite material.

14. The method of claim 1, wherein the etch mask pattern is formed of a metal or a metal alloy.

15. The method of claim 1, further comprising wet cleaning the substrate subsequent to plasma etching in a solution comprising ammonium hydroxide, hydrogen peroxide and water.

16. The method of claim 1, wherein the Li-based oxide features have a refractive index greater than 2.0.

17. The method of claim 1, wherein the Li-based oxide features comprise a lithium niobate or a lithium tantalate.

18. The method of claim 1, wherein the Li-based oxide features have a height of 10 nm to 200 nm.

19. The method claim 1, wherein the Li-based oxide features periodically repeat at a pitch in a range of 200 nm to 1 µm.

20. The method of claim 1, wherein the Li-based oxide features have a duty cycle of 0.1 to 0.9.

21. The method of claim 1, wherein forming the diffractive optical element comprises forming the diffractive optical element on a waveguide configured to guide visible light in a lateral direction crossing a direction of the visible light incident on the diffractive optical element.

22. The method of claim 1, wherein forming the diffractive optical element comprises forming on a waveguide comprising the Li-based oxide.

23. The method of claim 1, wherein the diffractive optical element is formed on the substrate comprising a waveguide, and wherein the waveguide is integrated with the diffractive optical element as a monolithically integrated structure.

24. The method of claim 1, wherein the diffractive optical element is formed on a waveguide, and wherein the waveguide comprises a material different from the Li-based oxide.

25. The method of claim 1, wherein the diffractive optical element serves as an incoupling optical element formed on the substrate that serves as a waveguide to couple light into the waveguide.

26. The method of claim 1, wherein the diffractive optical element serves as an outcoupling optical element formed on the substrate that serves as a waveguide to couple light out of the waveguide.

27. The method of claim 1, wherein the diffractive optical element is formed on the substrate comprising a waveguide configured to guide visible light having any wavelength in the visible spectrum that is incoupled or outcoupled by the diffractive optical element.

28. The method of claim 1, wherein the diffractive optical element is formed on the substrate comprising a waveguide configured to guide visible light that is incoupled by or outcoupled through the diffractive optical element via total internal reflection.

* * * * *